US012204242B2

(12) United States Patent
Watkins et al.

(10) Patent No.: US 12,204,242 B2
(45) Date of Patent: *Jan. 21, 2025

(54) MASTER MOLD FOR PATTERN TRANSFER

(71) Applicant: University of Massachusetts, Boston, MA (US)

(72) Inventors: James J. Watkins, South Hadley, MA (US); Feyza Dundar, Sugar Land, TX (US)

(73) Assignee: University of Massachusetts, Boston, MA (US)

( * ) Notice: Subject to any disclaimer, the term of this patent is extended or adjusted under 35 U.S.C. 154(b) by 732 days.

This patent is subject to a terminal disclaimer.

(21) Appl. No.: 16/467,896

(22) PCT Filed: Dec. 8, 2017

(86) PCT No.: PCT/US2017/065419
§ 371 (c)(1),
(2) Date: Jun. 7, 2019

(87) PCT Pub. No.: WO2018/107094
PCT Pub. Date: Jun. 14, 2018

(65) Prior Publication Data
US 2020/0073234 A1    Mar. 5, 2020

Related U.S. Application Data

(60) Provisional application No. 62/432,365, filed on Dec. 9, 2016.

(51) Int. Cl.
*G03F 7/00* (2006.01)
*B29C 33/38* (2006.01)
(Continued)

(52) U.S. Cl.
CPC ........ *G03F 7/0002* (2013.01); *B29C 33/3857* (2013.01); *B29C 33/424* (2013.01);
(Continued)

(58) Field of Classification Search
None
See application file for complete search history.

(56) References Cited

U.S. PATENT DOCUMENTS

2008/0212102 A1* 9/2008 Nuzzo ................. G01N 21/554
359/321
2009/0085095 A1 4/2009 Kamath et al.
(Continued)

FOREIGN PATENT DOCUMENTS

WO    WO-2018/107094 A1    6/2018

OTHER PUBLICATIONS

"European Application Serial No. 17879347.7, Response filed Feb. 15, 2021 to Extended European Search Report mailed Jul. 20, 2020", 15 pgs.
(Continued)

*Primary Examiner* — Joshua D Zimmerman
(74) *Attorney, Agent, or Firm* — Schwegman Lundberg & Woessner, P.A.

(57) ABSTRACT

In various embodiments, the present invention provides a method comprising: disposing upon a first substrate, a first coating; texturing the first coating with a stamp; treating the textured first coating to form a master mold; where the master mold contains a mirror image of the texture contained in the first coating; and transferring the texture from the master mold to a second substrate.

20 Claims, 17 Drawing Sheets

(51) Int. Cl.
  *B29C 33/42*    (2006.01)
  *B29C 59/16*    (2006.01)
  *B29L 7/00*     (2006.01)
  *B81C 1/00*     (2006.01)

(52) U.S. Cl.
  CPC ............ *B29C 59/16* (2013.01); *B81C 1/0046* (2013.01); *B29L 2007/001* (2013.01)

(56) References Cited

U.S. PATENT DOCUMENTS

| | | |
|---|---|---|
| 2012/0256346 A1 | 10/2012 | Ogino et al. |
| 2013/0286485 A1 | 10/2013 | Kan |
| 2013/0302567 A1* | 11/2013 | Chuang ................ G03F 7/0002 428/156 |
| 2014/0072720 A1 | 3/2014 | Watkins et al. |
| 2016/0023399 A1 | 1/2016 | Lee et al. |
| 2016/0102185 A1 | 4/2016 | Topolkaraev et al. |

OTHER PUBLICATIONS

"International Application Serial No. PCT/US2017/065419, International Search Report mailed Apr. 12, 2018", 6 pgs.

"International Application Serial No. PCT/US2017/065419, Invitation to Pay Add'l Fees and Partial Search Report mailed Feb. 12, 2018", 3 pgs.

"International Application Serial No. PCT/US2017/065419, Written Opinion mailed Apr. 12, 2018", 9 pgs.

Choi, et al., "Direct soft UV-NIL with resist incorporating carbon nanotubes", Microelectronic Engineering, vol. 85 Issue 1, (Jan. 1, 2008), 195-201.

Dai, et al., "Fabrication of surface-patterned ZnO thin films using sol-gel methods and nanoimprint lithography", Journal of Sol-Gel Science and Technology, Issue 1, (Jan. 10, 2011), 1-17.

Kothari, Rohit, et al., "Direct Imprint Patterning of 2-D and 3-D Nanoparticle/Polymer Hybrid and Crystalline Metal Oxide Structures for Printed Optical, Electronic, and Energy Devices", 2016 6th Electronic System-Integration Technology Conference (ESTC), (2016), 2 pgs.

Kothari, Rohit, et al., "Direct Patterning of Robust One-Dimensional, Two-Dimensional, and Three-Dimensional Crystalline Metal Oxide Nanostructures Using Imprint Lithography and Nanoparticle Dispersion Inks", ACS Publications DOI: 10.1021/acs.chemmater.6b05398 Chem. Mater. 2017, 29, (2017), 3908-3918.

Ryu, et al., "Fabrication of rigid stamp on a cylindrical substrate using hydrogen silsesquioxane/ZrO2 nanoparticle composite material for roll-to-roll nanoimprinting process", Fabrication of rigid stamp on a cylindrical substrate using hydrogen silsesquioxane/ZrO2 nanoparticle composite material for roll-to-roll nanoimprinting process, (Dec. 13, 2014), 628-633.

Schleunitz, et al., "Hybrid working stamps for high speed roll-to-roll nanoreplication with molded sol-gel relief on a metal backbone", Microelectronic Engineering, vol. 88 Issue 8, (Aug. 2011), 2113-2116.

"European Application Serial No. 17879347.7, Response to Communication pursuant to Rules 161(2) and 162 EPC filed Jan. 27, 2020", 12 pgs.

"European Application Serial No. 17879347.7, Extended European Search Report mailed Jul. 20, 2020", 10 pgs.

Gates, Byron, "New approaches to nanofabrication: Molding, printing, and other techniques", Chem Rev. 2005, 105(4), (Apr. 1, 2005), 1171-1196.

Ryu, Sang-Woo, "Fabrication of rigid stamp on a cylindrical substrate using hydrogen silsesquioxane ZrO2nanoparticle composite material for roll-to-roll nanoimprinting process", J Sol-Gel Sci Technol, 73(3), Springer, NY, US, (Dec. 13, 2014), 628-633.

Schift, H, "Ch. 9: Nanoimprint Lithography Patterning of Resists Using Molding", Springer Handbook of Nanotechnology, Springer, Berlin, (Jan. 1, 2010), 271-312.

Sharma, Hom N., et al., "Dynamic Triple-Mode Sorption and Outgassing in Materials", Scientific Reports / 7:2942 | DOI:10.1038/s41598-017-03091-3, (Jun. 7, 2017), 12.

"European Application Serial No. 17879347.7, Communication Pursuant to Article 94(3) EPC mailed Sep. 20, 23", 5 pgs.

"European Application Serial No. 17879347.7, Response filed Mar. 27, 2024 to Communication Pursuant to Article 94(3) EPC mailed Sep. 20, 2023", 25 pgs.

Sharma, Hom N., "Dynamic Triple-Mode Sorption and Outgassing in Materials", Scientific Reports 7:2942 | DOI:10.1038 s41598-017-03091-3, (Jun. 7, 2017), 12.

* cited by examiner

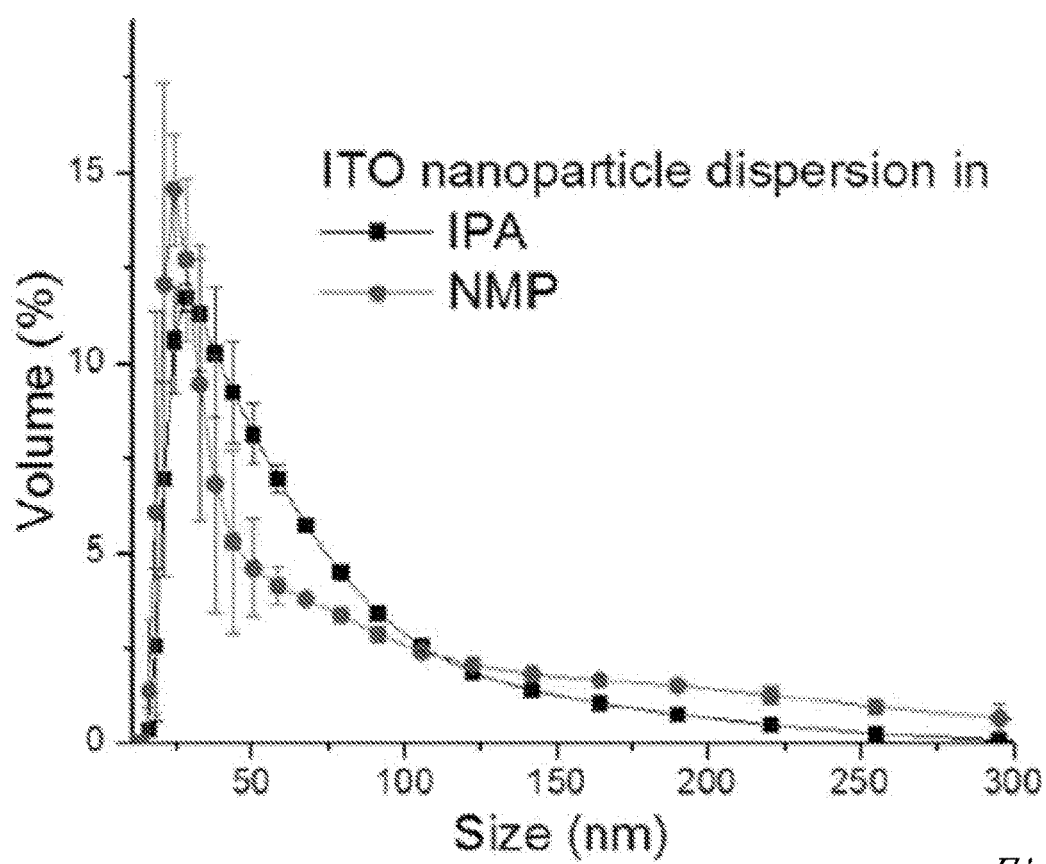
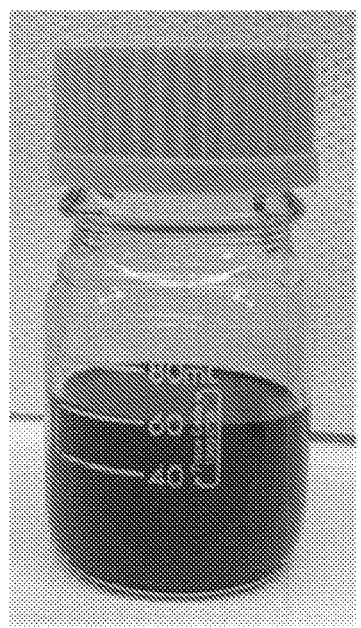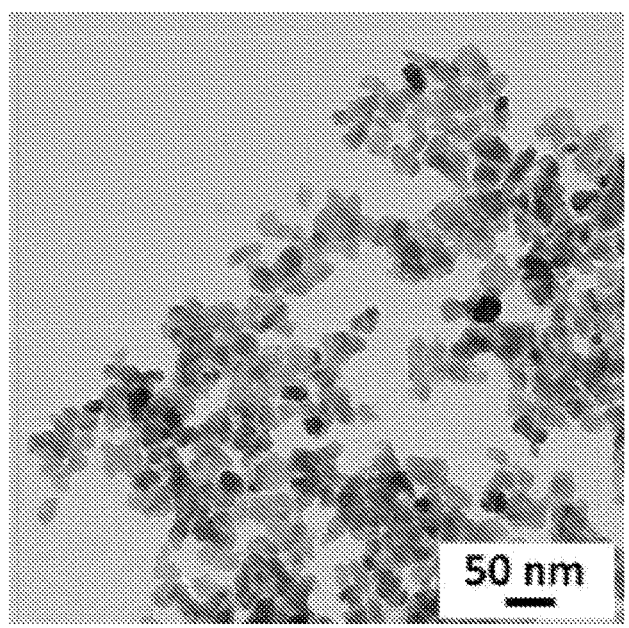
Fig.2A
Fig.2B  Fig.2C

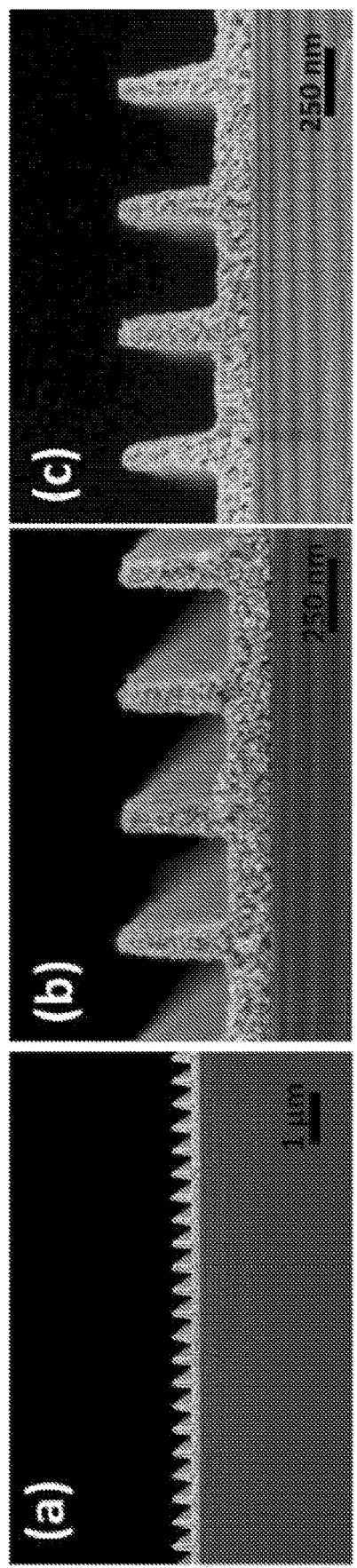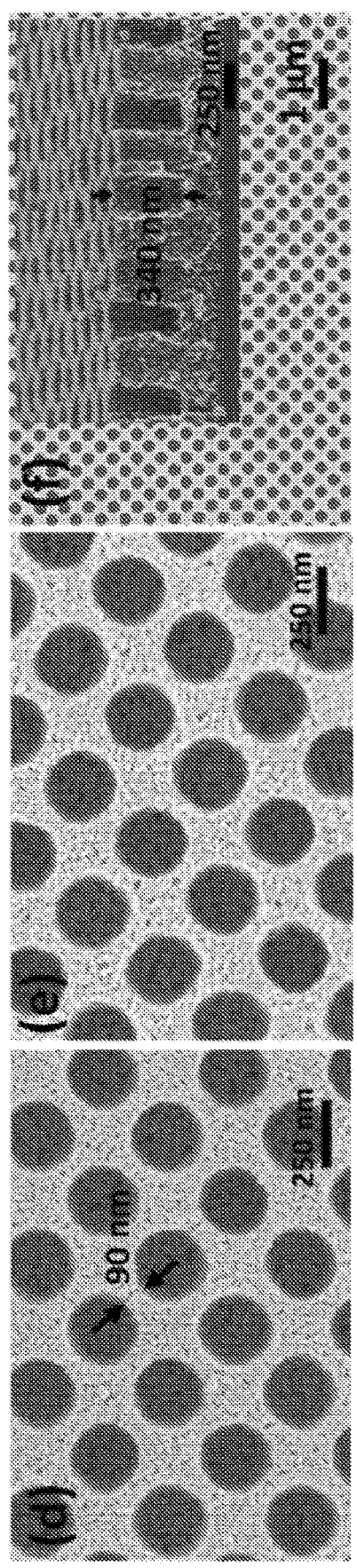
Fig. 3A  Fig. 3B  Fig. 3C  Fig. 3D  Fig. 3E  Fig. 3F

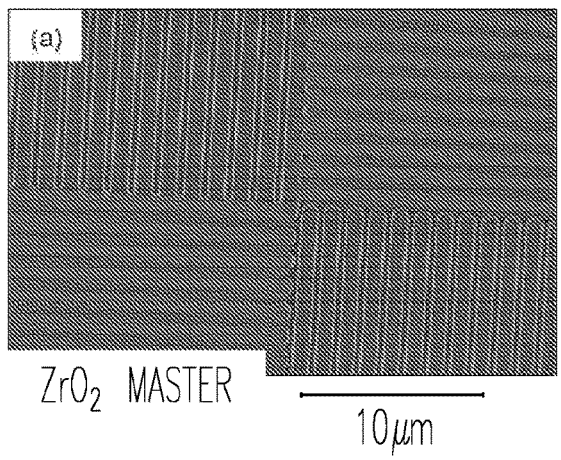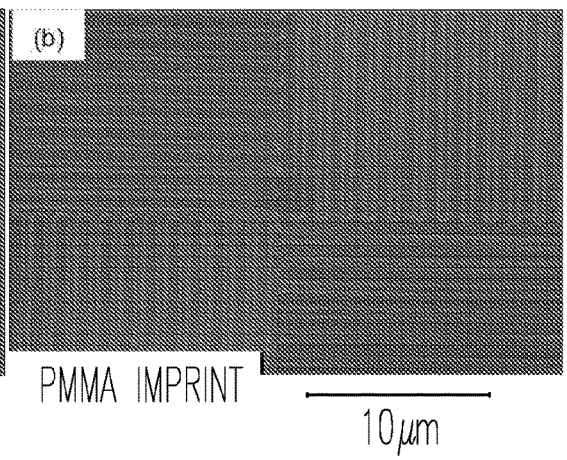
Fig. 11A     Fig. 11B
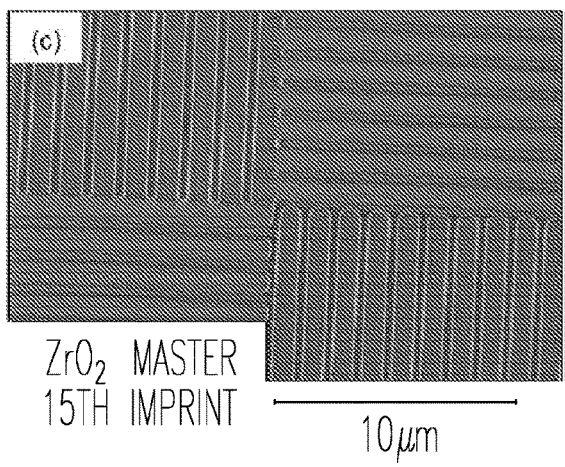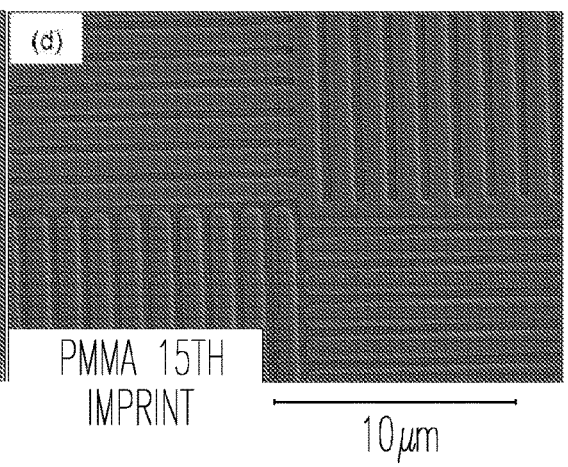
Fig. 11C     Fig. 11D
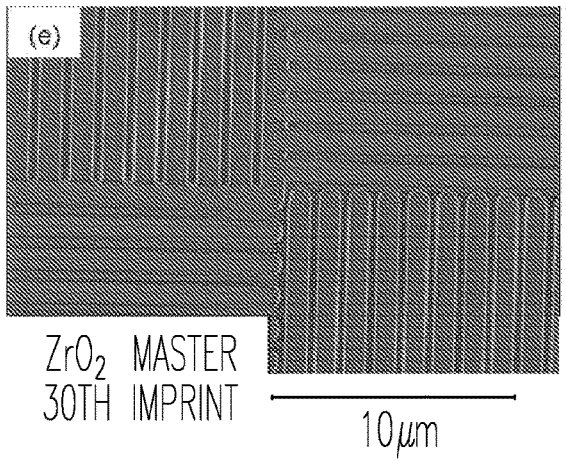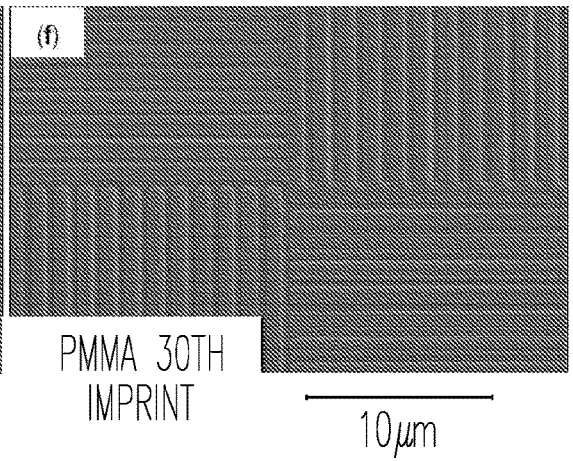
Fig. 11E     Fig. 11F

MASTER MOLD FOR PATTERN TRANSFER

CROSS-REFERENCE TO RELATED APPLICATION

This application claims the benefit of priority to U.S. Provisional Patent Application Ser. No. 62/432,365 entitled "MASTER MOLD FOR PATTERN TRANSFER AND METHODS OF MANUFACTURE THEREOF," filed Dec. 9, 2016, the disclosure of which is incorporated herein in its entirety by reference.

STATEMENT OF GOVERNMENT SUPPORT

This application is a U.S. National Stage Filing under 35 U.S.C. 371 from International Application No. PCT/US2017/065419, filed on Dec. 8, 2017, and published as WO2018/107094, which claims the benefit of priority to U.S. Provisional Patent Application Ser. No. 62/432,365 entitled "MASTER MOLD FOR PATTERN TRANSFER AND METHODS OF MANUFACTURE THEREOF," filed Dec. 9, 2016, the disclosures of which are incorporated herein in entireties by reference

BACKGROUND

This disclosure relates to a master mold for transferring a pattern to a moldable material and to methods of manufacture of the master mold.

It is often desirable to transfer micrometer sized and nanometer sized patterns from a master mold or die to a target surface that comprises polymers, polymeric composites, ceramics, metals, steel and the like. The transferred patterns can be used for manipulating surface wetting characteristics (by creating ultra-hydrophobic surfaces), adhesion, anti-microbial characteristics, changing color (including plasmonic color), light diffraction characteristics, friction and other attributes.

The pattern transfer to the target surface may be accomplished by thermal embossing; nanoimprint lithography (NIL), including thermal and UV assisted NIL); injection molding; rolling; hydraulic pressing; and various means of physical pattern transfer. Each of these techniques uses a master mold containing the features (or the negative of the features) to be transferred. In some cases, the master may be a metal shim. In other cases, e.g., for injection molding, the pattern may be transferred into a stainless-steel mold. The creation of such masters is typically accomplished in batch mode and can be prohibitively expensive. In addition, such masters are rigid which precludes their use in applications where flexibility is desirable.

It is therefore desirable to create master molds or dies that may be used to transfer patterns having micrometer sized or nanometer sized patterns that are flexible.

SUMMARY OF THE DISCLOSURE

In various embodiments, the present invention provides a method comprising: disposing upon a first substrate, a first coating; texturing the first coating with a stamp; treating the textured first coating to form a master mold; where the master mold contains a mirror image of the texture contained in the first coating; and transferring the texture from the master mold to a second substrate.

Various embodiments provide a mold comprising: a substrate; a textured first coating disposed on the substrate; where the textured first coating is derived from metal oxide nanoparticles that are calcined to form the mold.

Various further embodiments provide a method of preparing a mold, comprising the steps: (a) applying a nanoparticle coating to a surface of a substrate to obtain a coated substrate having a nanoparticle layer; (b) contacting the nanoparticle layer on the coated substrate with a textured solvent-permeable stamp so as to imprint a texture onto the nanoparticle layer; (c) transferring solvent away from the nanoparticle layer; and (d) removing the textured solvent-permeable stamp from the nanoparticle layer; so as to obtain a mold, wherein the nanoparticle coating comprises nanoparticles or nanoparticle precursors, or a combination thereof, dispersed in a solvent.

Various embodiments of the present disclosure provide certain advantages over other nanoimprint lithography techniques, at least some of which are unexpected. For example, according to various embodiments, a master mold is prepared by using a solvent-permeable stamp to imprint an ink containing nanoparticles or nanoparticle precursors which reduces the need for solvent transport into the stamp during patterning, thus simplifying the process and providing advantages in speed and scalability. According to various embodiments, the resulting imprinted nanostructures are highly crystalline with low residual organics and therefore undergo little shrinkage upon annealing or calcining. According to various embodiments, use of an ink containing such nanoparticles or nanoparticle precursors permits dewetting at the stamp-substrate interface and achieves residual layer free direct imprinting. According to various embodiments this technique has the further advantage of permitting a layer-by-layer strategy to produce 1-D, 2-D and 3-D nanostructures, including high aspect ratio nanostructures and sub-100 nm features. According to various embodiments this method also permits imprinting onto either a rigid or flexible substrate and achieving a rigid or flexible master mold. Additionally, according to various embodiments, the inks including said nanoparticle precursors as a sol and result in low thickness reductions during calcination and lower sheet resistance.

BRIEF DESCRIPTION OF THE FIGURES

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIG. 2A shows the size distribution of the nanoparticle and nanoparticle aggregates in suspensions before and after exchanging solvent, as obtained by dynamic light scattering (DLS); FIG. 2B shows optical image of indium tin oxide (ITO) nanoparticle (NP) suspension in NMP obtained after solvent exchange step, which is stable for over a year; and FIG. 2C shows transmission electron microscopy (TEM) image of ITO NPs with majority of the particles below 30 nm in size.

FIG. 3A shows the cross-section scanning electron microscope (SEM) image at a 1 μm length scale of an indium tin oxide (ITO) grating structure imprinted with a square inch-sized composite-polydimethylsiloxane (PDMS) stamp made using a silicon master mold; FIG. 3B shows the cross-section SEM images at a 250 μm length scales of an ITO grating structure imprinted with a square inch-sized composite-PDMS stamp made using the silicon master mold; FIG. 3C shows a cross-sectional view of the grating structure (Line-width at the base of the lines or LW, ~130 nm; line pitch or LP, ~450 nm; (LP) line height or LH, ~365 nm) after heating at 500° C. for 1 hour, providing a feature height shrinkage of ~4%; FIG. 3D shows via structures with hole radii (HR) ~125 nm, hole pitch (HP) ~340 nm and hole depth (HD) ~355 nm imprinted in a square array pattern. The imprinted structure therefore has a minimum hole-wall thicknesses of ~90 nm, suggesting that sub-100-nm features can also be imprinted using this strategy; FIG. 3E shows top views at 250 nm scale magnification of via patterns after heating at 500° C. for 1 hour; and FIG. 3F shows top views at two different magnifications of via patterns after heating at 500° C. for 1 hour.

FIG. 11A shows a scanning electron microscope (SEM) image of a patterned metal oxide nanoparticles on Si wafer by using solution assisted soft nanoimprint lithography (NIL), FIG. 11B shows a SEM image of inverse poly(methyl methacrylate) (PMMA) structures prepared by using a hard metal oxide mold via thermal NIL; FIG. 11C shows the same metal oxide mold after 15 consecutive imprints; FIG. 11D shows inverse PMMA structures as a $15^{th}$ replica; FIG. 11E shows the same metal oxide mold after 30 consecutive imprints; and FIG. 11F shows the inverse PMMA structures as a $30^{th}$ replica.

DETAILED DESCRIPTION

Figure 1:
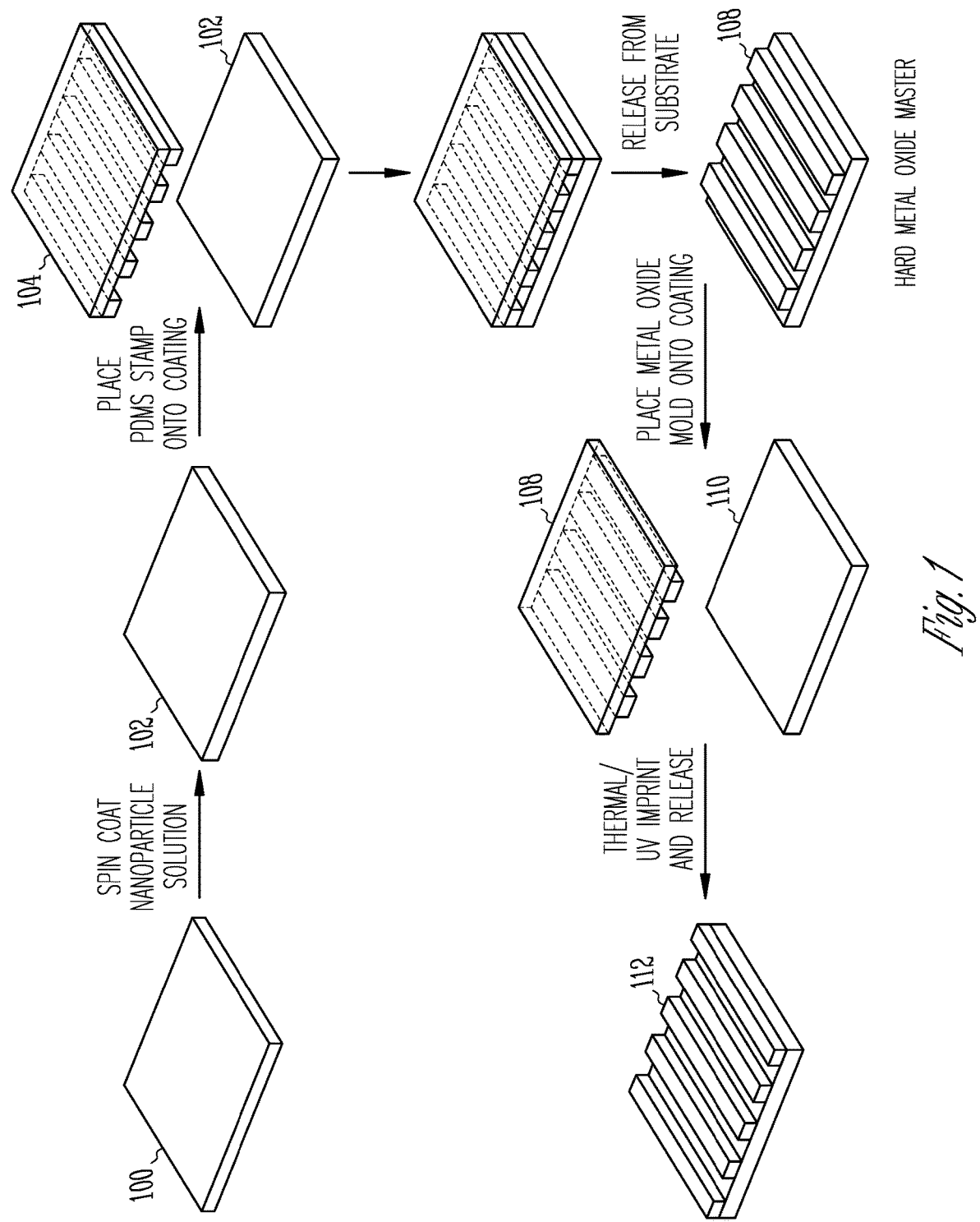
FIG. 1 is a schematic depiction of a method for manufacturing of a metal oxide master and also depicts the transferring of a pattern using the metal oxide master.

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Disclosed herein is a method of manufacturing a master mold that can be used to manufacture dimensionally stable 1-D, 2-D and 3-D high aspect ratio crystalline metal oxide microstructures or nanostructures (hereinafter structures). These structures are fabricated using soft nanoimprint lithography with inks that comprise nanoparticle (NP) dispersions in solvent or in sol-gel precursors for the metal oxide. The method comprises disposing a coating composition comprising a stabilized nanoparticle solution on a substrate. The coating is then textured with a solvent permeable stamp (e.g., a pattern is transferred to the coating with a stamp) and allowed to solidify to form a textured coating. The textured coating is then released from the substrate and treated to form a metal oxide master mold. The metal oxide master mold may be used to create other molds or alternatively to mold other coatings.

The method comprises disposing upon a first substrate, a first coating composition; where the first coating composition comprises metal oxide nanoparticles. The first coating may be a stabilized solution of metal oxide nanoparticles. The first coating composition is textured by contacting it with an elastomeric stamp that contains a desired texture. The elastomeric stamp may be solvent permeable. The first coating composition now textured is subjected to calcination to form a metal oxide master mold. The metal oxide master mold contains a mirror image of the texture contained in the first coating. It is used to transfer the texture to a second coating disposed on an optional second substrate.

The first coating composition (also referred to herein as a nanoparticle ink) contains first nanoparticles, optional nanoparticle precursors (precursors that are used to manufacture the first nanoparticles or other nanoparticles (second nanoparticles), an optional polymer or polymer precursor that can react with the first nanoparticle, and a solvent. In an embodiment, the solvent may be capable of stabilizing the nanoparticle dispersion, e.g., keeping the nanoparticles in solution without macrophase separating.

Specifically, a patterned 1-D, 2-D and 3-D dimensionally stable crystalline metal oxide nanostructure may be manufactured using a solution-based soft nanoimprint lithography (NIL) technique. A solvent permeable patterned elastomer stamp is used to imprint a coating (e.g., an ink containing crystalline nanoparticles (NP) that are dispersed in an organic solvent). The composition and physical properties of the coating can be altered by optionally doping crystalline NP based inks with UV/thermally curable metal oxide sol-gel precursors. Use of the curable sols in the ink imparts fluidity and enables imprinting at low solvent concentration in the ink. The use of nanoparticles dispersed in the sols as inks reduces the need for solvent transport into the stamp during patterning, thus simplifying the process and providing advantages in speed and scalability. The as-imprinted nanostructures are highly crystalline with low residual organics and therefore undergo little shrinkage (less than 5% in some cases) upon thermal annealing or calcining.

This method, according to various embodiments, is advantageous in that high aspect ratio nanostructures and sub-100-nm features are easily manufactured. Residual layer free direct imprinting (without etching) may be achieved by choosing the ink with the appropriate surface energy and optimum spin coating conditions to ensure dewetting at stamp-substrate interface. The technique may be used to create 3-D nanostructures by deploying a layer-by-layer imprint strategy. The method is scalable and can produce large area device quality nanostructures in a rapid fashion at a low cost.

With reference now to the FIG. 1, a method for manufacturing a metal oxide master and the transferring of pattern using the metal oxide master is shown. FIG. 1 depicts a substrate 100 upon which a nanoparticle coating composition 102 is disposed. The substrate 100 may be a metal substrate, a polymeric substrate or a ceramic substrate. The substrate may be rigid (e.g., having an elastic modulus greater than $10^5$ Pascals) or flexible (e.g., having an elastic modulus of less than $10^5$ Pascals).

Exemplary metal substrates comprise steel, brass, bronze, nickel, iron, aluminum, titanium, copper, cobalt, or the like, or a combination thereof. Exemplary polymeric substrates comprise polyolefins, polysiloxanes, polyfluoroethylenes, polyacrylates, polystyrenes, polyesters, or the like, or a combination thereof. Exemplary ceramics are silica, alumina, titania, quartz, zirconia, ceria, or the like, or a combination thereof. An exemplary substrate is a silica substrate.

The substrate can have a smooth surface or a rough surface initially. Rough surfaces can be planarized prior to disposing a coating composition on them and using the method disclosed herein to manufacture a master mold. The coating composition can be repeatedly applied and calcined till the substrate surface becomes smooth.

In an embodiment, the nanoparticle coating composition 102 that is disposed on the substrate 100 comprises an ink that contains a first nanoparticle (NP) dispersion in a solvent. The nanoparticle dispersion can contain metal oxides, metal carbides, metal oxycarbides, metal nitrides, metal oxynitrides, metal borides, metal borocarbides, metal boronitrides, metal silicide, metal borosilicides, or the like, or a combination thereof. Metal oxide nanoparticles are preferred. In another embodiment, the metal oxide nanoparticles are crystalline.

It can be desirable for the metal oxide nanoparticles to be crystalline in nature, though amorphous particles or semi-crystalline particles may also be used. In an exemplary embodiment, the nanoparticle dispersion comprises nanoparticles of titania, silica, zirconia, ceria, indium titanium oxide, tin oxide, indium oxide, antimony oxide, or the like, or a combination thereof. In certain embodiments, the nanoparticle dispersion comprises nanoparticles of one of titania, silica, zirconia, ceria, indium titanium oxide, tin oxide, indium oxide and antimony oxide. In other embodiments, nanoparticle dispersion comprises nanoparticles of two or more of titania, silica, zirconia, ceria, indium titanium oxide, tin oxide, indium oxide and antimony oxide. Emulsions that contain nanoparticles may be used in the nanoparticle coating. Emulsions may be water based or based on organic solvents. Aqueous metal oxide emulsions can be commercially obtained from NALCO, Naperville Il.

In another embodiment, the nanoparticle coating composition 102 may also comprise sol-gel precursors for the first nanoparticle or may contain sol-gel precursors for a second nanoparticle. By way of example, while the first nanoparticle is titanium dioxide, the sol-gel precursor may produce indium tin oxide nanoparticles upon being reacted. The precursors can be crosslinked and converted to nanoparticles using a sol-gel reaction. The precursors can produce nanoparticles of titania, silica, zirconia, ceria, indium titanium oxide, tin oxide, indium oxide, antimony oxide, or the like, or a combination thereof, when subjected to the sol-gel reaction. Examples of the nanoparticle precursors are metal alkoxides such as titanium isopropoxide, titanium butoxide, tetraethoxysilane (tetraethylorthosilicate), tetramethoxysilane, vinyltrialoxysilanes (e.g., vinyltrimethoxysilane), aluminum sec-butoxide, zirconium isopropoxide, cerium isopropoxide, acetylacetonate titanate chelate (commercially available from DuPont TYZOR organic titanates), triethanolamine titanate chelate (commercially available from DuPont TYZOR organic titanates), lactic acid titanate chelate (commercially available from DuPont TYZOR organic titanates), zirconate chelates, zirconium propionate, yttrium butoxide, yttrium nitrate, or the like, or a combination thereof. In some embodiments, the method may be performed by use of a sol-gel or sol-gel precursor of only the first nanoparticle, or a sol-gel or sol-gel precursor of only the second nanoparticle, or in the absence of any sol-gel or sol-gel precursors.

Nanoparticles have average particle sizes as measured by x-ray scattering of less than 100 nanometers, preferably less than 90 nanometers, and more preferably less than 80 nanometers. The average particle size is generally larger than 5 nanometers, or larger than 6 nanometers. In further embodiments, the average particle size can be less than 10 nanometers. In yet further embodiments, the majority of particles are below 8 nm.

The nanoparticles may be present in the coating composition in an amount of 10 to 95 wt %, 50 to 90 wt %, or 60 to 85 wt %, based on the total weight of the coating composition before the solvent has evaporated. The nanoparticles may be present in the coating composition in an amount of 60 to 99 wt %, 70 to 98 wt %, or 80 to 95 wt %, based on the total weight of the coating composition after the solvent has evaporated and all organic matter is removed after calcining.

The relative proportions of crystalline nanoparticles and nanoparticle precursor (e.g., a sol) in the coating composition determines dimensional stability upon calcination. Films with greater than 80 wt % nanoparticle content from nanoparticles yield thickness reductions upon calcination of less than 20%. Films fabricated using nanoparticles and nanoparticle precursors also display lower sheet resistance compared to the films fabricated using only nanoparticles. If the coating composition contains a nanoparticle precursor (e.g., a sol) in addition to the first nanoparticles, the precursor is present in the coating composition in an amount of 5 to 30 wt %, preferably 8 to 25 wt % based on the total weight of the coating composition before the solvent has evaporated.

In an embodiment, precursors to organic polymers or organic homopolymers that can react with the nanoparticles or react with the precursors to the nanoparticles may optionally be added to the nanoparticle coating. Examples of such precursors to organic polymers are acrylates, epoxies, siloxanes, or the like, or a combination thereof. The precursors to organic polymers react with the metal oxide particles or with the precursors to the metal oxide nanoparticles to form inorganic-organic polymers. The precursors to the organic polymers or the organic polymers may be modified in order to react them with the nanoparticles or the nanoparticle precursors. For example, the organic polymers or their precursors may be modified with metal alkoxides in order to react them with the nanoparticles.

A precursor to an organic polymer is an acrylate or acrylic acid monomer having a structure represented by formula (1):

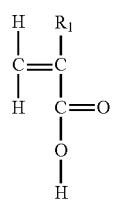

(1)

where $R_1$ is a hydrogen or an alkyl group having 1 to 10 carbon atoms. In some embodiments, $R_1$ is an alkyl group having any of 1 to 5 carbon atoms, 2 to 10 carbon atoms or 3 to 10 carbon atoms. In a specific embodiment, $R_1$ is methyl. Examples of the first repeat monomer are acrylates and alkyl acrylates such as, for example, methyl acrylates, ethyl acrylates, propyl acrylates, acrylic acid, or the like, or a combination thereof.

Another precursor to an organic polymer is an acrylate monomer having a structure represented by formula (2):

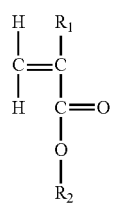

(2)

where $R_1$ is a hydrogen or an alkyl group having 1 to 10 carbon atoms and $R_2$ is a $C_{1-10}$ alkyl, a $C_{3-10}$ cycloalkyl, or a $C_{7-10}$ aralkyl group. In some embodiments, $R_1$ is an alkyl group having any of 1 to 5 carbon atoms, 2 to 10 carbon atoms or 3 to 10 carbon atoms. In a specific embodiment, $R_1$ is methyl. In some embodiments $R_2$ is a $C_{2-10}$ alkyl or $C_{3-10}$ alkyl. In specific embodiments, $R_2$ is methyl, benzyl or ethyl. Examples of the acrylate monomer having a structure represented by formula (2) are methacrylate, ethacrylate, propyl acrylate, methyl methacrylate, methyl ethylacrylate, methyl propylacrylate, ethyl ethylacrylate, methyl arylacrylate, or the like, or a combination thereof. The precursor to an organic polymer may be a (meth)acrylate. The term "(meth)acrylate" implies that either an acrylate or methacrylate is contemplated unless otherwise specified.

In another embodiment, the acrylate is a monomer represented by Formula (3):

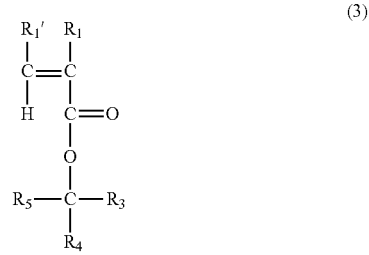

(3)

where $R_1$ is a hydrogen, an alkyl group having 1 to 10 carbon atoms, or a fluoroalkyl group having 1 to 10 carbon atoms; where $R_1'$ is hydrogen, a five membered ring or a six membered ring having at least one heteroatom, where the heteroatom is oxygen, nitrogen, sulfur, or phosphorus; where at least one of $R_3$, $R_4$ and $R_5$ is a $C_{1-30}$ alkyl, $C_{3-30}$ cycloalkyl, $C_{6-30}$ aryl, $C_{7-30}$ alkaryl, $C_{7-30}$ aralkyl, $C_{1-30}$ heteroalkyl, $C_{3-30}$ heterocycloalkyl, $C_{6-30}$ heteroaryl, $C_{7-30}$ heteroalkaryl, $C_{7-30}$ heteroaralkyl, a $C_{2-10}$ fluoroalkyl group, an alkylene oxide, or a combination comprising at least one of the foregoing groups, where each of the groups is covalently bonded to one or more vinyl groups.

Another precursor to aforementioned organic polymer is an epoxy monomer. The epoxy may be an aromatic, aliphatic or cycloaliphatic epoxy resin. In an embodiment, a useful epoxy resin is the diglycidyl ether of bisphenol F, also known as Epon 862® and having the structure shown in Formula (4):

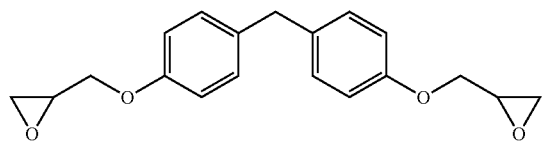

(4)

In another embodiment, the epoxy resin is a modified diglycidyl ether of bisphenol F also known as a modified EPON 862® and having the structure shown in Formula (5):

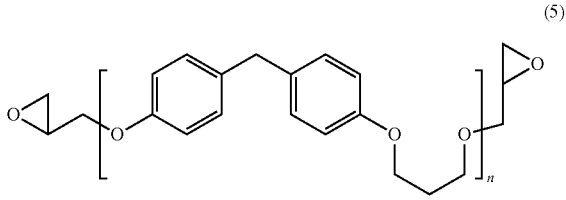

(5)

where n is the number of repeat units. The epoxy resin of the formula (5) is produced by polymerizing bisphenol F with the EPON 862.

In an embodiment, the epoxy resin may have the structure shown in the Formula (6) below:

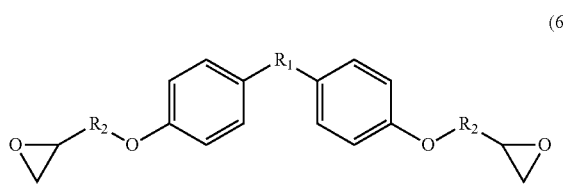

(6)

where $R_1$ is a single bond, —O—, —S—, —C(O)—, or a $C_{1-18}$ organic group. The $C_{1-18}$ organic bridging group may be cyclic or acyclic, aromatic or non-aromatic, and can further comprise heteroatoms such as halogens, oxygen, nitrogen, sulfur, silicon, or phosphorous. The $C_{1-18}$ organic group can be disposed such that the $C_6$ arylene groups connected thereto are each connected to a common alkylidene carbon or to different carbons of the $C_{1-18}$ organic bridging group. In the Formula (6), $R_2$ is a $C_{1-30}$ alkyl group, a $C_{3-30}$ cycloalkyl, a $C_{6-30}$ aryl, a $C_{7-30}$ alkaryl, a $C_{7-30}$ aralkyl, a $C_{1-30}$ heteroalkyl, a $C_{3-30}$ heterocycloalkyl, a $C_{6-30}$ heteroaryl, a $C_{7-30}$ heteroalkaryl, a $C_{7-30}$ heteroaralkyl, a $C_{2-10}$ fluoroalkyl group, or a combination thereof.

In yet another exemplary embodiment, the epoxy resin is the reaction product of 2-(chloromethyl)oxirane and 4-[2-(4-hydroxyphenyl)propan-2-yl]phenol also known as bisphenol A-epichlorohydrin based epoxy (also known as bisphenol A diglycidyl ether) of the Formula (7) below:

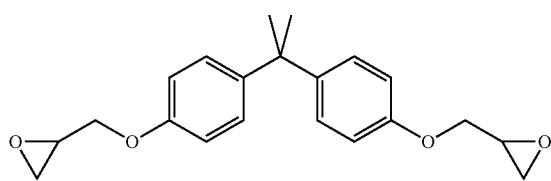

(7)

The epoxy resin of Formula (7) is commercially available as EPON 828. Other exemplary variations of Formula (6) that may be used are shown in the Formulas (8) and (9). In an embodiment, one variation of the Formula (6) that may be used is shown in the Formula (8) below.

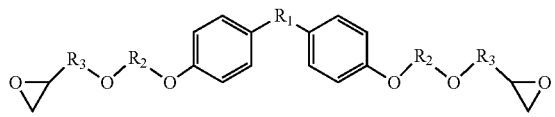

(8)

where $R_1$ is detailed above in Formula (6), $R_2$ and $R_3$ may be the same or different and are independently a $C_{1-30}$ alkyl group, a $C_{3-30}$ cycloalkyl, a $C_{6-30}$ aryl, a $C_{7-30}$ alkaryl, a $C_{7-30}$ aralkyl, a $C_{1-30}$ heteroalkyl, a $C_{3-30}$ heterocycloalkyl, a $C_{6-30}$ heteroaryl, a $C_{7-30}$ heteroalkaryl, a $C_{7-30}$ heteroaralkyl, a $C_{2-10}$ fluoroalkyl group, or a combination thereof.

In an exemplary embodiment, an epoxy having the structure of Formula (9) may be used in the coating.

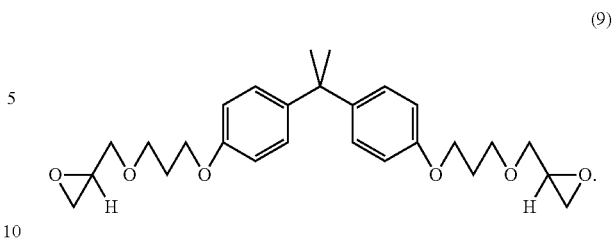

(9)

Examples of suitable epoxies are diglycidyl ether of bisphenol A, diomethane diglycidyl ether, 2,2-bis(4-glycidyloxyphenyl)propane, 2,2'-((1-methylethylidene)bis(4,1-phenyleneoxymethylene))bisoxirane, 2,2-bis(4-(2,3-epoxypropyloxy)phenyl)propane, 2,2-bis(4-hydroxyphenyl)propane, diglycidyl ether, 2,2-bis(p-glycidyloxyphenyl)propane, 4,4'-bis(2,3-epoxypropoxy)diphenyldimethylmethane, 4,4'-dihydroxydiphenyldimethylmethane diglycidyl ether, 4,4'-isopropylidenebis(1-(2,3-epoxypropoxy)benzene), 4,4'-isopropylidenediphenol diglycidyl ether, bis(4-glycidyloxyphenyl)dimethylmethane, bis(4-hydroxyphenyl)dimethylmethane diglycidyl ether, diglycidyl ether of bisphenol F, 2-(butoxymethyl)oxirane, the reaction product of 2-(chloromethyl)oxirane and 4-[2-(4-hydroxyphenyl)propan-2-yl]phenol also known as bisphenol A-epichlorohydrin based epoxy, modified bisphenol A-epichlorohydrin based epoxy, diglycidyl 1,2-cyclohexanedicarboxylate, 1,4-cyclohexanedimethanol diglycidyl ether, a mixture of cis and trans 1,4-cyclohexanedimethanol diglycidyl ether, neopentyl glycol diglycidyl ether, resorcinol diglycidyl ether, 4,4'-methylenebis(N,N-diglycidylaniline), 3,4-epoxycyclohexylmethyl 3,4-epoxycyclohexanecarboxylate, 3,4-epoxy-1-cyclohexanecarboxylic acid, 3,4-epoxycyclohexan-1-yl) methyl ester, tert-butyl glycidyl ether, 2-Ethylhexyl glycidyl ether, epoxypropoxypropyl terminated polydimethylsiloxanes, neopentyl glycol diglycidyl ether, 1,4-cyclohexanedimethanol diglycidyl ether, 1,3-bis[2-(3,4-epoxycyclohexyl)ethyl]tetramethyldisiloxane, trimethylolpropane triglycidyl ether, diglycidyl 1,2-cyclohexanedicarboxylate, or the like, or a combination thereof.

In an embodiment, one of the foregoing epoxies may be combined with the precursor to a metal oxide and an epoxysilane (shown in the formula (10) below) in order to produce the nanoparticle coating composition on the substrate.

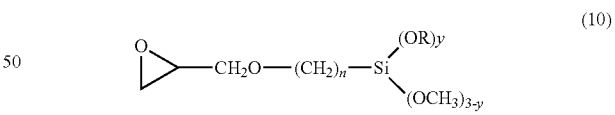

(10)

In yet another embodiment, the nanoparticles may be modified by using an oligomer that is endcapped with an alkoxysilane. Exemplary polymers are polyethers, polysiloxanes, polyacrylates, or the like, or a combination thereof. The polymers are generally oligomers having a weight average molecular weight of less than 2000 grams per mole.

The polymer precursors or polymers may be used in amounts of 5 to 50 wt %, preferably 7 to 30 wt %, and more preferably 10 to 20 wt %, based on the total weight of the coating composition after the solvent has evaporated.

The nanoparticles together with any precursors (to the nanoparticles, the polymers, or the like) are mixed with a solvent. The solvent will vary depending upon the chemistry of the nanoparticle and the precursors, if any. Aprotic polar solvents such as propylene carbonate, ethylene carbonate, butyrolactone, acetonitrile, benzonitrile, nitromethane, nitrobenzene, sulfolane, dimethylformamide, N-methylpyrrolidone (NMP), or the like, or combinations thereof may be used. Polar protic solvents such as water, methanol, ethanol, propanol, isopropanol, butanol, or the like, or combinations thereof may also be used. Other non-polar solvents such a benzene, toluene, methylene chloride, carbon tetrachloride, hexane, diethyl ether, tetrahydrofuran, or the like, or combinations thereof may be used. Exemplary solvents are N-methylpyrrolidone (NMP), ethanol, methanol and 1,2-propane diol, or a mixture thereof.

The solvent may often be fully or partially interchanged with another solvent during the preparation of the coating composition to stabilize the nanoparticles or to change the surface tension of the solution. Alcohols are often interchanged with the N-methylpyrrolidone. The solvent is present in the coating composition in an amount of 5 to 80 wt %, preferably 10 to 40 wt %, and more preferably 15 to 30 wt %, based on the weight of the coating composition prior to the removal of the solvent.

After the coating composition is disposed on the substrate, it is textured using an elastomeric stamp. The elastomeric stamp may be heated during the texturing process. In other words, the elastomeric stamp may be heated to a temperature of 30 to 250° C. as it contacts the coating composition. The elastomeric stamps can facilitate the extraction of the solvent from the coating while texturing the coating. Suitable elastomers for use in the stamp are polysiloxanes, polybutadienes, polyisoprenes, styrene-butadiene rubber, poly(styrene)-block-poly(butadiene), poly(acrylonitrile)-block-poly(styrene)-block-poly(butadiene) (ABS), polychloroprenes, epichlorohydrin rubber, polyacrylic rubber, fluorosilicone elastomers, fluoroelastomers, perfluoroelastomers, polyether block amides (PEBA), chlorosulfonated polyethylene, ethylene propylene diene rubber (EPR), ethylene-vinyl acetate elastomers, or the like, or a combination thereof.

In an embodiment, the elastomer is a polysiloxane having the structure of formula (11)

(11)

wherein each R is independently a $C_1$-$C_{10}$ alkyl, a $C_3$-$C_{10}$ cycloalkyl, a $C_6$-$C_{14}$ aryl, a $C_7$-$C_{13}$ alkylaryl or a $C_7$-$C_{13}$ arylalkyl and where n is 100 to 50,000. Combinations of the foregoing R groups can be present in the same monomer. Exemplary polysiloxanes include polydimethylsiloxane, polydiethylsiloxane, polydiphenylsiloxanes, and combinations thereof.

In an embodiment, the stamp may be a bilayer stamp having two layers of elastomer—a backing layer (which provides support for the texturing layer) and the texturing layer, which may be harder (such as hydrosilane endcapped-PDMS) than the backing layer.

The elastomeric stamp absorbs the solvent present in the coating because it may be microporous or alternatively because it has an affinity for the solvent. After absorbing the solvent and texturing the coating composition, the textured coating now substantially devoid of the solvent may be annealed or calcined to remove residual solvent and to produce the mold master stamp 108 (See FIG. 1). As seen in the FIG. 1, the mold master stamp 108 has a textured surface which is a mirror image of the texture on the stamp. As will be detailed below, this texturing may be transmitted to other coated surfaces to produce textured surfaces. The mold master stamp, 108 may also be used to manufacture a second generation of mold master stamps 108 that may be used in the manufacturing of textured surfaces thus increasing productivity.

The calcination may occur at a temperature of 200 to 800° C., preferably 300 to 700° C. and more preferably 400 to 650° C. The calcination temperature can be greater than the solvent boiling point, preferably greater than the degradation point of any polymer or polymeric precursor used in the coating and preferably greater than the melting point of any crystalline material present in the final mold master stamp 108.

The mold master stamp 108 may then be used to stamp other coatings 110 to produce the texture disposed thereon. The coatings 110 may be spun cast, spray painted, doctor bladed, hand painted, dip coated on a second substrate (not shown) and contacted with the mold master stamp 108 to reproduce the texture on the coating 110. In another embodiment, the coating 110 may be crosslinked using radiation (UV light, electron beam radiation, x-ray radiation, microwave radiation, or the like, or a combination thereof) at room temperature or at an elevated temperature to produce an image of the texture contained on the mold master stamp 108.

Crosslinkable coatings comprise epoxy polymers, unsaturated polyester polymers, polyimide polymers, bismaleimide polymers, bismaleimide triazine polymers, cyanate ester polymers, vinyl polymers, benzoxazine polymers, benzocyclobutene polymers, acrylics, alkyds, phenol-formaldehyde polymers, novolacs, resoles, melamine-formaldehyde polymers, urea-formaldehyde polymers, hydroxymethylfurans, isocyanates, diallyl phthalate, triallyl cyanurate, triallyl isocyanurate, unsaturated polyesterimides, or the like, or a combination thereof.

In another embodiment, the coating 110 may comprise a thermoplastic resin. Examples of thermoplastic resins that may be textured comprise a polyolefin, a polyacetal, a polyacrylic, a polycarbonate, a polystyrene, a polyester, a polyamide, a polyamideimide, a polyarylate, a polyarylsulfone, a polyethersulfone, a polyphenylene sulfide, a polyvinyl chloride, a polysulfone, a polyimide, a polyetherimide, a polytetrafluoroethylene, a polyetherketone, a polyether etherketone, a polyether ketone ketone, a polybenzoxazole, a polyoxadiazole, a polybenzothiazinophenothiazine, a polybenzothiazole, a polypyrazinoquinoxaline, a polypyromellitimide, a polyquinoxaline, a polybenzimidazole, a polyoxindole, a polyoxoisoindoline, a polydioxoisoindoline, a polytriazine, a polypyridazine, a polypiperazine, a polypyridine, a polypiperidine, a polytriazole, a polypyrazole, a polypyrrolidine, a polycarborane, a polyoxabicyclononane, a polydibenzofuran, a polyphthalide, a polyanhydride, a polyvinyl ether, a polyvinyl thioether, a polyvinyl alcohol, a polyvinyl ketone, a polyvinyl halide, a polyvinyl nitrile, a polyvinyl ester, a polysulfonate, a polynorbornene, a polysulfide, a polythioester, a polysulfonamide, a polyurea, a polyphosphazene, a polysilazane, a polyurethane, or the like, or a combination thereof.

The texture on the surface of the master mold may comprise objects of variable geometries. The height of the texture may be about 20 to 3000 nanometers, 200 to 400 nanometers, or 200 to 300 nanometers. The spacing (average periodicity) between the various parts of the texture may be about 10 nanometers to 1 micrometer.

This method, according to some embodiments, is advantageous in that imprinting into the coating compositions (e.g., inks) comprising a high loading of crystalline nanoparticles in a nanoparticle precursor sol prepared using metal salt precursors offers good dimensional stability and rapid processability. Unlike nanoparticle films coated from solvent only, films coated from coating compositions that contain nanoparticle and nanoparticle precursor sol dispersions may be imprinted even several hours after spin coating.

The method, according to various embodiments, can also be advantageous in that it can be used to reproduce high aspect ratio geometrical structures on a surface that is to be textured. The aspect ratios of structures produced on the textured surface can be greater than 5:1, greater than 15:1 or greater than 30:1.

The high aspect ratio crystalline inorganic oxide nanostructures can be directly fabricated by practicing solvent/thermal/UV-assisted soft nanoimprint lithography on coating compositions (inks) containing metal oxide nanoparticles. This nanoparticle based soft imprinting technique is capable of producing large area nanopatterns in a rapid fashion. The low-shrinkage at elevated temperatures observed in crystalline nanoparticle based nanopatterns (less than 8% linear shrinkage in imprinted feature height upon heat treatment at 500° C.) is a substantial development over previously explored sol-gel based methods that suffer from significant shrinkage when the structures are first condensed to form the metal oxide network and then heated to obtain a crystalline morphology. The porosity in the nanoparticle based features is comparable to that obtained by sol-gel based methods. The technique is also extended to fabricate residual-layer free nanopatterns and 3-D nanopatterns by using a print-planarize-print approach.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts can be carried out in any order without departing from the principles of the disclosure, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%.

The term "organic group" as used herein refers to any carbon-containing functional group. Examples can include an oxygen-containing group such as an alkoxy group, aryloxy group, aralkyloxy group, oxo(carbonyl) group; a carboxyl group including a carboxylic acid, carboxylate, and a carboxylate ester; a sulfur-containing group such as an alkyl and aryl sulfide group; and other heteroatom-containing groups. Non-limiting examples of organic groups include OR, OOR, OC(O)N(R)$_2$, CN, CF$_3$, OCF$_3$, R, C(O), methylenedioxy, ethylenedioxy, N(R)$_2$, SR, SOR, SO$_2$R, SO$_2$N(R)$_2$, SO$_3$R, C(O)R, C(O)C(O)R, C(O)CH$_2$C(O)R, C(S)R, C(O)OR, OC(O)R, C(O)N(R)$_2$, OC(O)N(R)$_2$, C(S)N(R)$_2$, (CH$_2$)$_{0-2}$N(R)C(O)R, (CH$_2$)$_{0-2}$N(R)N(R)$_2$, N(R)N(R)C(O)R, N(R)N(R)C(O)OR, N(R)N(R)CON(R)$_2$, N(R)SO$_2$R, N(R)SO$_2$N(R)$_2$, N(R)C(O)OR, N(R)C(O)R, N(R)C(S)R, N(R)C(O)N(R)$_2$, N(R)C(S)N(R)$_2$, N(COR)COR, N(OR)R, C(=NH)N(R)$_2$, C(O)N(OR)R, C(=NOR)R, and substituted or unsubstituted (C$_1$-C$_{100}$)hydrocarbyl, wherein R can be hydrogen (in examples that include other carbon atoms) or a carbon-based moiety, and wherein the carbon-based moiety can be substituted or unsubstituted.

The term "alkyl" as used herein refers to straight chain and branched alkyl groups having from 1 to 18 carbon atoms, 1 to about 10 carbon atoms, or from 1 to 8 carbon atoms. Examples of straight chain alkyl groups include those with from 1 to 8 carbon atoms such as methyl, ethyl, n-propyl, n-butyl, n-pentyl, n-hexyl, n-heptyl, and n-octyl groups. Examples of branched alkyl groups include, but are not limited to, isopropyl, iso-butyl, sec-butyl, t-butyl, neopentyl, isopentyl, and 2,2-dimethylpropyl groups. As used herein, the term "alkyl" encompasses n-alkyl, isoalkyl, and anteisoalkyl groups as well as other branched chain forms of alkyl. In some embodiments, representative substituted alkyl groups can be substituted one or more times with any of the groups listed herein, for example, amino, hydroxy, cyano, carboxy, nitro, thio, alkoxy, and halogen groups.

The term "cycloalkyl" as used herein refers to cyclic alkyl groups such as, but not limited to, cyclopropyl, cyclobutyl, cyclopentyl, cyclohexyl, cycloheptyl, and cyclooctyl groups. In some embodiments, the cycloalkyl group can have 3 to 30 ring members, 3 to about 8-12 ring members, or in certain embodiments 3 to 10 ring members, whereas in other embodiments the number of ring carbon atoms range from 3 to 4, 5, 6, or 7. Cycloalkyl groups further include polycyclic cycloalkyl groups such as, but not limited to, norbornyl, adamantyl, bornyl, camphenyl, isocamphenyl, and carenyl groups, and fused rings such as, but not limited to, decalinyl, and the like. Cycloalkyl groups also include rings that are substituted with straight or branched chain alkyl groups as defined herein. Representative substituted cycloalkyl groups can be mono-substituted or substituted more than once, such as, but not limited to, 2,2-, 2,3-, 2,4-2,5- or 2,6-disubstituted cyclohexyl groups or mono-, dior tri-substituted norbornyl or cycloheptyl groups, which can be substituted with, for example, amino, hydroxy, cyano, carboxy, nitro, thio, alkoxy, and halogen groups. The term "cycloalkenyl" alone or in combination denotes a cyclic alkenyl group.

The term "aryl" as used herein refers to cyclic aromatic hydrocarbon groups that do not contain heteroatoms in the ring. Thus aryl groups include, but are not limited to, phenyl, azulenyl, heptalenyl, biphenyl, indacenyl, fluorenyl, phenanthrenyl, triphenylenyl, pyrenyl, naphthacenyl, chrysenyl, biphenylenyl, anthracenyl, and naphthyl groups. In some embodiments, aryl groups contain about 6 to 30 carbons or in other embodiments 6 to about 14 carbons in the ring portions of the groups. Aryl groups can be unsubstituted or substituted, as defined herein. Representative substituted aryl groups can be mono-substituted or substituted more than once, such as, but not limited to, a phenyl group substituted at any one or more of 2-, 3-, 4-, 5-, or 6-positions of the phenyl ring, or a naphthyl group substituted at any one or more of 2- to 8-positions thereof.

The term "aralkyl" as used herein refers to alkyl groups as defined herein in which a hydrogen or carbon bond of an alkyl group is replaced with a bond to an aryl group as defined herein. Representative aralkyl groups include benzyl and phenylethyl groups and fused (cycloalkylaryl)alkyl groups such as 4-ethyl-indanyl. Aralkenyl groups are alkenyl groups as defined herein in which a hydrogen or carbon bond of an alkyl group is replaced with a bond to an aryl group as defined herein.

The term "alkylaryl" as used herein refers to aryl groups as defined herein in which a hydrogen or carbon bond of an aryl group is replaced with a bond to an alkyl group as defined herein.

The term "heteroaryl" as used herein refers to aromatic ring compounds containing 5 or more ring members, of which, one or more is a heteroatom such as, but not limited to, N, O, and S; for instance, heteroaryl rings can have 5 to about 8-12 ring members. A heteroaryl group is a variety of a heterocyclyl group that possesses an aromatic electronic structure. A heteroaryl group designated as a $C_2$-heteroaryl can be a 5-ring with two carbon atoms and three heteroatoms, a 6-ring with two carbon atoms and four heteroatoms and so forth. Likewise a $C_4$-heteroaryl can be a 5-ring with one heteroatom, a 6-ring with two heteroatoms, and so forth. The number of carbon atoms plus the number of heteroatoms sums up to equal the total number of ring atoms. Heteroaryl groups include, but are not limited to, groups such as pyrrolyl, pyrazolyl, triazolyl, tetrazolyl, oxazolyl, isoxazolyl, thiazolyl, pyridinyl, thiophenyl, benzothiophenyl, benzofuranyl, indolyl, azaindolyl, indazolyl, benzimidazolyl, azabenzimidazolyl, benzoxazolyl, benzothiazolyl, benzothiadiazolyl, imidazopyridinyl, isoxazolopyridinyl, thianaphthalenyl, purinyl, xanthinyl, adeninyl, guaninyl, quinolinyl, isoquinolinyl, tetrahydroquinolinyl, quinoxalinyl, and quinazolinyl groups. Heteroaryl groups can be unsubstituted, or can be substituted with groups as is discussed herein. Representative substituted heteroaryl groups can be substituted one or more times with groups such as those listed herein.

The term "heterocycloalkyl" as used herein refers to alkyl groups as defined herein in which a hydrogen or carbon bond of an alkyl group as defined herein is replaced with a bond to a heterocyclyl group as defined herein. Representative heterocyclyl alkyl groups include, but are not limited to, furan-2-yl methyl, furan-3-yl methyl, pyridine-3-yl methyl, tetrahydrofuran-2-yl ethyl, and indol-2-yl propyl.

The term "heteroaralkyl" as used herein refers to alkyl groups as defined herein in which a hydrogen or carbon bond of an alkyl group is replaced with a bond to a heteroaryl group as defined herein.

The term "heteroalkaryl" as used herein refers to aryl groups as defined herein in which a hydrogen or carbon bond of an aryl group is replaced with a bond to a heteroalkyl group as defined herein.

The term "fluoroalkyl" as used herein refers to alkyl groups as defined herein in which a hydrogen or carbon bond of an alkyl group is replaced with a bond to a fluorine.

The terms "halo," "halogen," or "halide" group, as used herein, by themselves or as part of another substituent, mean, unless otherwise stated, a fluorine, chlorine, bromine, or iodine atom.

The term "monovalent" as used herein refers to a substituent connecting via a single bond to a substituted molecule. When a substituent is monovalent, such as, for example, F or Cl, it is bonded to the atom it is substituting by a single bond.

The term "weight-average molecular weight" as used herein refers to $M_w$, which is equal to $\Sigma M_i^2 n_i / \Sigma M_i n_i$, where $n_i$ is the number of molecules of molecular weight $M_i$. In various examples, the weight-average molecular weight can be determined using light scattering, small angle neutron scattering, X-ray scattering, and sedimentation velocity.

The term "cure" as used herein refers to exposing to radiation in any form, heating, or allowing to undergo a physical or chemical reaction that results in hardening or an increase in viscosity. A flowable thermoplastic material can be cured by cooling it such that the material hardens. A flowable thermoset material can be cured by heating or otherwise exposing to irradiation, or both, such that the material hardens.

The term "solvent" as used herein refers to a liquid that can dissolve a solid, liquid, or gas. Non-limiting examples of solvents are silicones, organic compounds, water, alcohols, ionic liquids, and supercritical fluids.

EXAMPLES

Various embodiments of the present disclosure can be better understood by reference to the following Examples which are offered by way of illustration. The present disclosure is not limited to the Examples given herein.

The terms and expressions that have been employed are used as terms of description and not of limitation, and there is no intention in the use of such terms and expressions of excluding any equivalents of the features shown and described or portions thereof, but it is recognized that various modifications are possible within the scope of the embodiments of the present disclosure. Thus, it should be understood that although the present disclosure has been specifically disclosed by specific embodiments and optional features, modification and variation of the concepts herein disclosed may be resorted to by those of ordinary skill in the art, and that such modifications and variations are considered to be within the scope of embodiments of the present disclosure.

Example 1

This example demonstrates the fabrication of the elastomeric stamp. In this example, the stamp was manufactured from polydimethylsiloxane (PDMS). Patterned PDMS stamps were made by casting PDMS against silicon master molds. The silicon master molds were cleaned in concentrated sulfuric acid and followed by treating for 15 minutes in an oxygen plasma cleaner. The silicon masters were then placed in a degassed glass jar at 80° C., to which 1 volume percent (vol %) of heptadecafluoro-1,1,2,2-tetrahydrodecyl) dimethylchlorosilane (obtained from Gelest Corp.) is introduced for a 12 hour period. In this process a self-assembled monolayer of a long chain fluorinated alkane is created on silicon master molds which reduces their surface energy and facilitates easy removal of cured PDMS stamps casted against them in the next step.

Sylgard 184 silicone elastomer kits (Ellsworth Adhesive) were used to make PDMS stamps from the silicon masters with low aspect-ratio line patterns having line width (LW), ~425 nm; line pitch (LP), ~950 nm; line height (LH), ~480 nm. A 10:1 (by weight) ratio of base to curing agent was thoroughly mixed and a ~3 mm thick layer was poured on the silicon master molds. Vacuum was pulled (for 5-10 minutes) to remove air inclusions and dissolved gases. The PDMS replica was then cured at 70° C. for 5 hours and peeled away from the master mold to obtain in patterned stamp form.

Bilayer composite-PDMS structures were used to make stamps from hard silicon master molds bearing high aspect-ratio and densely packed features. The bilayer stamp consists of a patterned thin layer of h-PDMS backed with a thick soft Sylgard 184 PDMS layer, and were made using a method described at Odom, T. W.; Love, J. C.; Wolfe, D. B.; Paul, K. E.; Whitesides, G. M. Improved pattern transfer in soft lithography using composite stamps. Langmuir 2002, 18, 5314-5320, which is incorporated herein in its entirety by reference. A h-PDMS layer is important as Sylgard 184 PDMS has insufficient mechanical strength to prevent deformation of high aspect ratio densely packed features. In a typical process to make h-PDMS, 1.7 g of (7.0-8.0% vinylmethylsiloxane)-dimethylsiloxane copolymer(trimethylsiloxyl terminated, VDT-731, Gelest Corp.) was mixed with one drop of 2, 4, 6, 8-tetramethyltetravinylcyclotetrasiloxane (Fluka-87927, Sigma-Aldrich Co. Ltd.) and 9 µl of platinum-divinyltetramethyldisiloxane complex in xylene (SIP-6831, Gelest). The mixing was done in a 25 ml glass vial for 30 seconds using a magnetic stirrer. The mixture was then immediately degassed on a Schlenk line by pulling vacuum for 1 minute. To the degassed mixture, 0.5 ml of (25-30% methylhydrosiloxane)-dimethylsiloxane (hydride terminated, Gelest Corp.) was drop wise added and stirred for 1 minute. The h-PDMS mixture was then immediately spin-coated on a patterned silicon master at 1000 RPM for 40 seconds, followed by heating at 60° C. for 2 minutes to cure h-PDMS. A ~3 mm-thick layer of Sylgard 184 pre-polymer mixture (made as described above) was poured onto the h-PDMS layer and cured at 70° C. for 5 hours. The cured bilayer composite-PDMS was then peeled away from the master mold.

Example 2

This example details the preparation of nanoparticle dispersion for the coating compositions (inks). Solvent exchanged indium tin oxide (ITO) nanoparticle (NP) dispersions in N-methylpyrollidone (NMP) were obtained by adding NMP to commercially available ITO dispersion in isopropanol (IPA), followed by evaporation of IPA. Equal weights of ITO (~30 wt %, 20-30 nm average particle size, $In_2O_3$:$SnO_2$=90:10 by weight) NPs dispersion in IPA (Nano-structured & Amorphous Materials, Inc.) and NMP (N-methyl-2-pyrrolidone 99%, Sigma-Aldrich Co. Ltd.) are mixed and dried under a stream of air to remove IPA. The solid content of ITO in the dispersion obtained after solvent exchange, as determined by heat treating the NP dispersion at 500° C. for 1 hour was found to be 25.9 wt %.

To obtain titanium dioxide ($TiO_2$) NPs dispersion NMP-methanol solvent mixture, acid stabilized titanium oxide (anatase, 15 wt %, 5-30 nm average particle size) NPs dispersion in water (Nanostructured & Amorphous Materials, Inc.) was mixed with NMP and methanol in 2:1:1 weight ratio and dried under a stream of air to remove majority of solvents (up to 50% solvent remaining in the obtained mixture). The resulting dried slurry was redispersed in 1:1 NMP-methanol solvent mixture using vortex-mixing and sonication to obtain 15 wt % $TiO_2$ NPs dispersion, which can be further diluted with methanol in order to adjust the thickness of spin coated films. Solvent exchanging with only NMP caused agglomeration. Addition of methanol upon removal of water improves the dissociation of the acid sufficiently to avoid destabilization of the suspension. Moreover, the NMP-methanol solvent mixture provided high quality spin coated films whereas the use of NMP-water mixture caused striation in the films.

To obtain ~3 wt % of $TiO_2$ NPs dispersion in propanediol-methanol solvent mixture, one part (by volume) of titanium dioxide (anatase, around 20 wt %, 15 nm average particle size) NPs dispersion in 1, 2-propanediol (US Research Nanomaterials, Inc.) was diluted with 5 parts of methanol (ACS grade, Fisher Scientific).

All NPs dispersions were subject to ultrasonication for a few minutes before using as ink.

Example 3

This example details the preparation of nanoparticles and nanoparticle precursor dispersion coating compositions. To prepare a nanoparticle/nanoparticle precursor ITO-ink, an ITO NP dispersion in NMP was mixed with ITO sol in NMP. The ITO sol in NMP was prepared by dissolving 0.235 grams of tin (IV) acetate ($Sn(CH_3CO_2)_4$, Sigma-Aldrich Co. Ltd.) in 6.75 grams of NMP at 80° C., followed by solubilizing 3.02 grams of indium(III) nitrate hydrate ($In(NO_3)_3 \cdot xH_2O$ (x=4.5, as determined by weight loss upon heating in vacuum at 105° C. for 24 hours), Sigma-Aldrich Co. Ltd.). This composition is chosen to create ITO with $In_2O_3$:$SnO_2$=90:10 (by weight) upon calcining the sol at 500° C.

To prepare 80 NP/20 sol $TiO_2$ ink, 15 wt % $TiO_2$ NPs dispersion in NMP-methanol was mixed with titanium diisopropoxide bis(acetylacetonate) (TPA, $[(CH_3)_2CHO]_2Ti(C_5H_7O_2)_2$, 75 wt % in isopropanol, Sigma-Aldrich Co. Ltd.) in proportions to provide 80:20 (by weight) NPs to TPA in the ink.

Characterization and Measurements

Aggregates size distributions in NP dispersions diluted to 5 wt % solids were measured by dynamic light scattering (Malvern Zetasizer 3000 HSa instrument). Transmission electron microscopy was performed in bright field imaging mode using a JEOL 2000 FX TEM operated at an accelerating voltage of 200 kV. The silicon master was gold sputtered using a sputter coater (CR 108) for 60 seconds prior to imaging. Scanning electron microscopy was performed on a field emission scanning electron microscope (Magellan 400). Thickness measurements of planar films were performed with a surface profilometer (Veeco Dektak 150). Sheet resistance of planar ITO films (on $SiO_2$ (300 nm)/Si wafer) were measured using four-point probe technique (Keithley 2400 instrument) with evaporated gold electrodes for contacts. Transmittance measurements of planar films on quartz substrate were performed on UV/VIS/NIR spectrometer (Perkin Elmer Lambda 1050) using integrating sphere accessory. X-ray diffraction (XRD) experiments were performed using X-ray diffractometer (Philips PANalytical X'Pert) equipped with copper Kα X-ray (0.1542 nm) source operating at 45 kV and 40 mA. Average crystallite size by XRD was measured using Scherrer equation. Spectroscopic ellipsometry measurements for determination of refractive index (RI) were performed using variable-angle spectroscopic ellipsometer (RC2-DI from J. W. Woollam Co., Inc.). Ellipsometric data was collected for 55°, 60°, 65° and 70° angles of incidence. RI for ITO was determined by fitting ellipsometric data in 450-1500 nm spectral range with a bilayer model consisting of general oscillator layer on silicon substrate. The fitting was performed using instrument's VASE-software (complete EASE™ version 2.30 software, J. A. Woollam Co., Inc.). RI for $TiO_2$ was determined by fitting ellipsometric data in 380-1500 nm spectral range with a bilayer model consisting of a Cauchy layer on silicon substrate. Porosity was calculated using Lorentz-Lorenz effective medium approximation model as:

$$\frac{n_{eff}^2 - 1}{n_{eff}^2 + 2} = (1 - f)\frac{n_c^2 - 1}{n_c^2 + 2}$$

where $n_{eff}$ is the measured RI of the film, f is the volume fraction of the pores (percentage porosity=100×f) and $n_c$ is the RI of dense material in the absence of porosity.

Example 4

In this example, coating compositions (inks) that comprise ITO NPs dispersed in NMP are obtained by replacing isopropyl alcohol (IPA) with NMP in commercially available ITO dispersion in IPA. The choice of solvent is driven by three factors, the solvent should have low vapor pressure to allow a broad time-window for spin-coating and imprinting, it should not promote excessive swelling of PDMS stamp, and it must have similar polarity as of the solvent present in the initial dispersion in order to ensure dispersion stability after solvent exchange step. FIG. 2A shows the size distribution of the NPs and NP aggregates in suspensions before and after exchanging solvent, as obtained by dynamic light scattering (DLS). The average aggregate sizes before and after exchanging solvent from IPA to NMP were 49 nm and 54 nm respectively, suggesting that there is negligible additional agglomeration of NPs after exchanging solvent. FIG. 2B shows optical image of ITO NP suspension in NMP obtained after solvent exchange step, which is stable for over a year. FIG. 2C shows transmission electron microscopy (TEM) image of ITO NPs with majority of the particles below 30 nm in size.

FIG. 3 (FIGS. 3A to 3F) shows SEM images of ITO nanostructures imprinted using crystalline ITO NP-based ink and a patterned bilayer composite-PDMS stamp. The composite-PDMS stamp consists of thin layer of patterned h-PDMS backed by a thick layer of Sylgard-184 PDMS. The pattern in h-PDMS layer of the composite-PDMS stamp is replicated using silicon master mold. FIGS. 3A and 3B shows the cross-section SEM images at two different length scales of ITO grating structures imprinted with a square inch-sized composite-PDMS stamp made using the silicon master mold. Line-width at the base of the lines (LW), line pitch (LP) and line height (LH) of printed grating structure are ~130 nm, ~450 nm and ~380 nm respectively, whereas the LW, LP and LH of the silicon master from which patterned composite-PDMS stamp is made are ~210 nm, ~450 nm and ~480 nm respectively. The reduction in the printed features dimensions is due to the volumetric shrinkage accompanied by removal of solvent through PDMS during imprinting.

The imprinted features are uniform in size and shape throughout the pattern. Once the imprinting is achieved, these crystalline NP-based features maintain structural integrity upon heating at elevated temperatures, which is often required during calcination and annealing to improve physical properties, for example conductivity in the case of ITO. FIG. 3C shows a cross-sectional view of the grating structure (LW, ~130 nm; P, ~450 nm; LH, ~365 nm) after heating at 500° C. for 1 hour, providing a feature height shrinkage of ~4%. X-ray diffraction (XRD) patterns for planar ITO NP-based thin film before and after heat treatment at 500° C., indicate Bragg reflections corresponding to cubic $In_2O_3$ (space group $Ia\bar{3}$) crystal structure.

The average grain size before and after heat treatment as determined by the line broadening of primary (222) reflection using Scherrer equation was 14.6 nm and 16.2 nm respectively, suggesting that shrinkage upon heating is mostly due to the removal of residual organic material in the films. FIGS. 3D and 3E shows via structures with hole radii (HR) ~125 nm, hole pitch (HP) ~340 nm and hole depth (HD) ~355 nm imprinted in a square array pattern. The imprinted structure therefore has a minimum hole-wall thicknesses of ~90 nm, suggesting that sub-100-nm features can also be imprinted using this strategy. FIGS. 3E and 3F show top views at two different magnifications of via patterns after heating at 500° C. for 1 hour. The HR, HP and HD of 500° C. heated sample were ~125 nm, ~340 nm and ~340 nm respectively, suggesting a low linear-shrinkage of less than 5%.

The surface areas of these high aspect-ratio line and hole patterns is ~2.7 fold and ~4.3 fold that of their projected areas respectively. Such high surface area transparent conductive oxide nanopatterns are useful for many applications, for example as solar cell electrodes for improved device efficiency. The residual ITO layer at the base of the patterns is desirable for such an application, and can be eliminated if required by control of the substrate surface energies and solvent wetting.

The dynamics of pattern generation depend on the rate of solvent removal via diffusion into the PDMS stamp, which can result in prolonged imprint times at room temperature. The diffusion rate can be improved by imprinting at moderately high temperatures. To assess the speed and reproducibility for creating the patterned nanostructures, 24 consecutive 2.54 cm×2.54 cm array pattern of ITO gratings were imprinted using a single PDMS stamp (replicated from a silicon master with LW, ~475 nm; LP, ~950 nm; LH, ~475 nm) at 120° C. The ink was spin coated on Si wafers for 2 minutes and the stamp was placed on the substrate. The samples were then heated at 120° C. for 15 seconds and the stamp was removed to obtain the patterned nanostructure.

Figure 4:
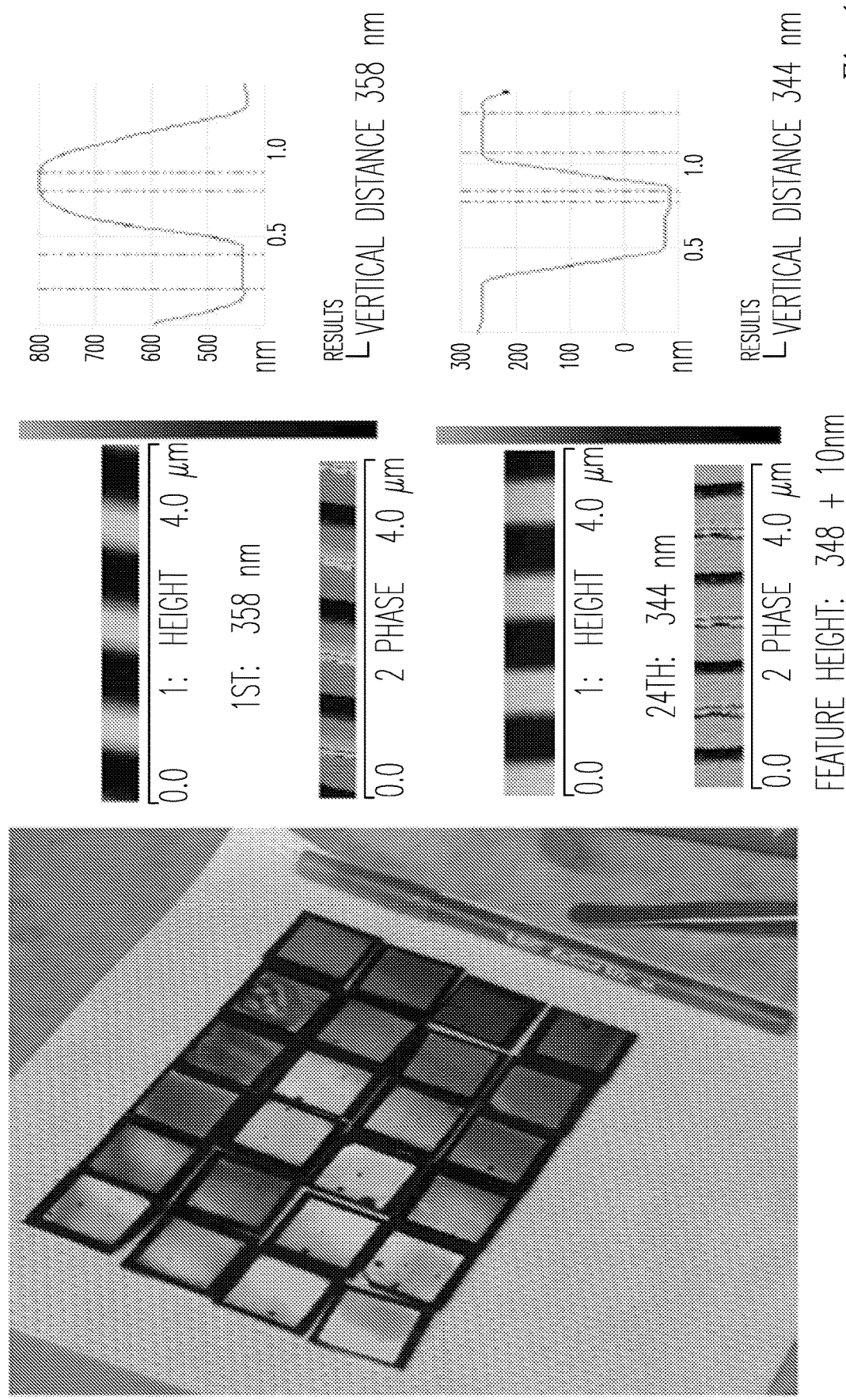
FIG. 4 shows a digital photograph of the 24 samples and shows that the line height for all samples as measured by atomic force microscopy (AFM) varied between 338-358 nm.

FIG. 4 shows a digital photograph of the 24 samples; the line height for all samples as measured by atomic force microscopy (AFM) varied between 338-358 nm. Such short imprinting times are crucial for high volume manufacturing of nanostructures.

Figure 5B:
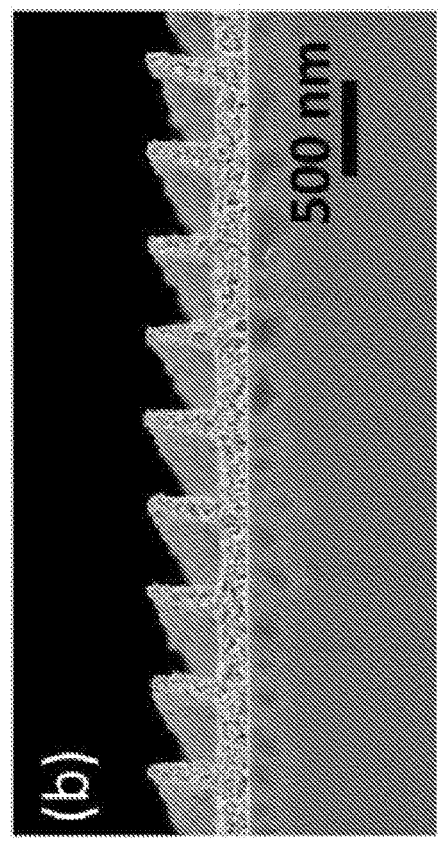
FIG. 5B shows the grating pattern of the FIG. 5A upon calcination at 500° C. for 1 hour, and shows a structure height reduced to ~355 nm (approximately 8% shrinkage)
Figure 5A:
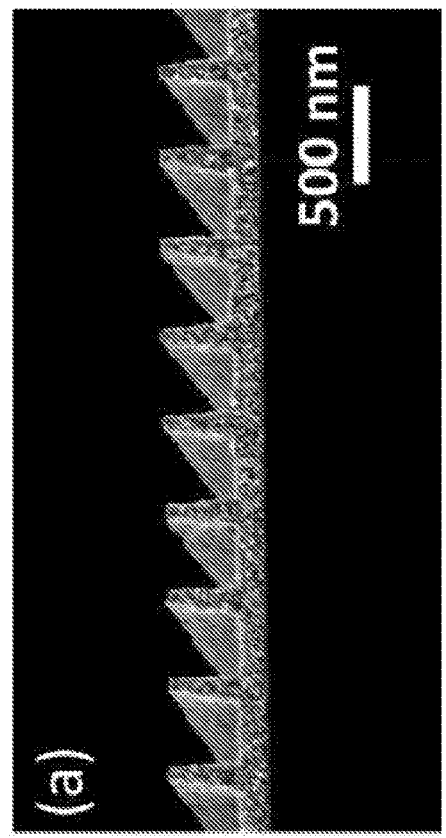
FIG. 5A shows gratings imprinted at 150° C. with ~385 nm tall lines.

Imprinting into the inks comprising high loading of crystalline ITO NPs in an ITO sol prepared using metal salt precursors also offers good dimensional stability and rapid processability. The ink is prepared by mixing ITO NP suspensions in NMP and ITO sols (indium nitrate and tin (IV) acetate solution in NMP) in the desired proportion, e.g., to provide 'x' wt % ITO solid content from NP and '100-x' wt % from sol upon calcination at 500° C. The compositions are denoted by 'x NP/100-x sol ITO-ink', and the corresponding films are likewise denoted by 'x NP/100-x sol ITO'. FIGS. 5A and 5B shows ITO gratings imprinted using 80 NP/20 sol ITO-ink. The composite-PDMS stamp used for imprinting was made using silicon master mold. Unlike NP films coated from solvent only, films coated from NP/sol dispersions could be imprinted even several hours after spin coating. To achieve rapid patterning the composite-PDMS stamp was placed and the substrate was heated at 150° C. for 30 seconds to convert the imprinted viscous NP/sol dispersion into a rigidified structure. FIG. 5A shows gratings imprinted at 150° C. with ~385 nm tall lines. The pattern was then calcined at 500° C. for 1 hour to remove residual organic material and convert the nascent amorphous binder into a crystalline phase, which resulted in line height reduction to 355 nm (~8% linear shrinkage). FIG. 5B shows the grating pattern upon calcination at 500° C. for 1 hour. The structure height is reduced to ~355 nm (approximately 8% shrinkage).

The shrinkage in feature height at each step during the fabrication process using 80 NP/20 sol ITO-ink, and also using NP-based ITO inks without sol-gel precursors described earlier are summarized in Table 1. Table 1 shows line height (LH) and the shrinkage in feature height during imprinting and heat treatment steps for fabrication of ITO gratings using ink composed of different proportions of ITO NPs and ITO sol-gel precursor. Shrinkage observed in the LH of as-imprinted samples with respect to the LH of master mold is represented as 'shrinkage-I', and shrinkage observed in the LH of heat treated samples with respect to the LH of as-imprinted samples is represented as 'shrinkage-HT'.

TABLE 1

|  | LH of master mold | LH/shrinkage-I (for as-imprinted sample) | LH/shrinkage-HT (for 500° C. heat treated sample) |
| --- | --- | --- | --- |
| 100 NP ITO | 480 nm | 380 nm/21% | 365 nm/4% |
| 80 NP/20 sol ITO | 480 nm | 385 nm/20% | 355 nm/8% |

Figure 6A:
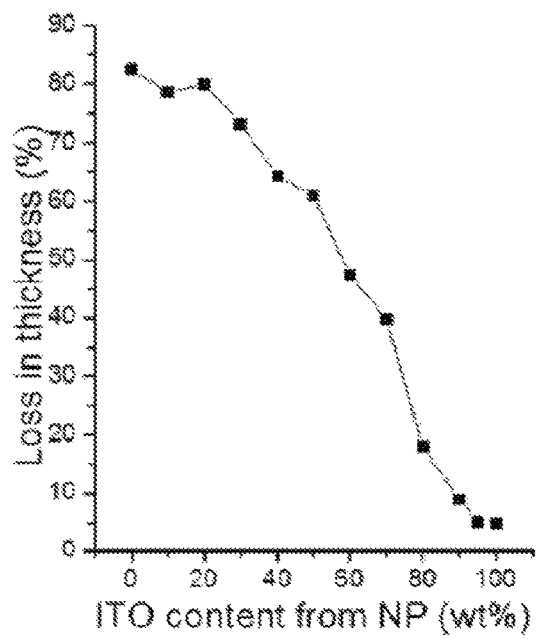
FIG. 6A shows shrinkage in planar indium tin oxide (ITO) thin films composed of different proportions of ITO nanoparticles (NPs) and the ITO sol-gel precursor (based on solid content contributed by the two components upon calcination at 50° C.)
Figure 6B:
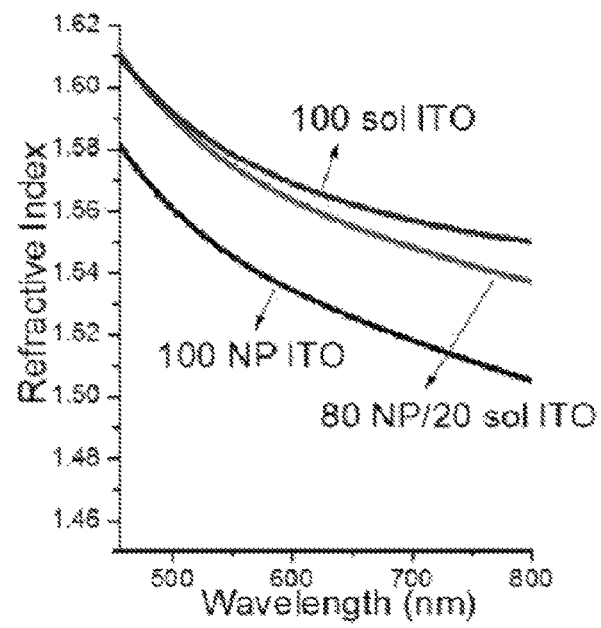
FIG. 6B shows the refractive index of such planar ITO thin films calcined at 500° C.
Figure 6C:
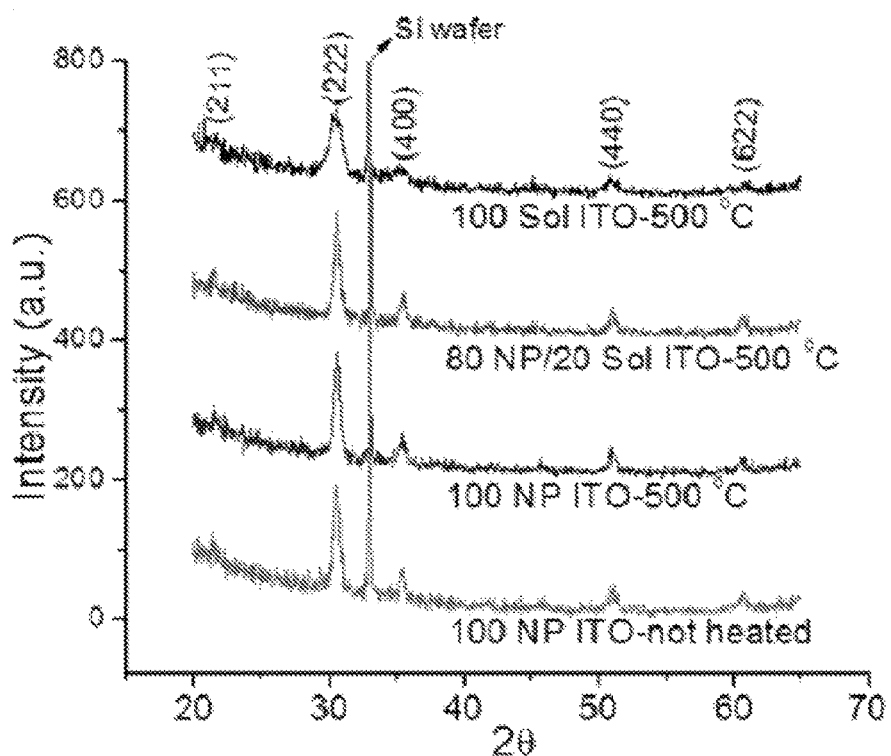
FIG. 6C shows x-ray diffraction (XRD) data for the calcined planar 100 sol ITO and 80 NP/20 sol ITO thin films indicating a crystalline morphology with average grain sizes 7.6 nm and 16.2 nm respectively.

FIG. 6A shows shrinkage in planar ITO thin films composed of different proportions of ITO NPs and the ITO sol-gel precursor (based on solid content contributed by the two components upon calcination at 50° C.). Initial thickness is measured after drying the spin coated planar film at room temperature for 72 hours. Percentage loss in thickness is determined after calcination at 500° C. for 1 hour. FIG. 6B shows the refractive index of planar ITO thin films calcined at 500° C. FIG. 6C shows XRD data for the calcined planar 100 sol ITO and 80 NP/20 sol ITO thin films indicating a crystalline morphology with average grain sizes 7.6 nm and 16.2 nm respectively. Inks with lower ITO sol content, for example 90 NP/10 sol ITO-ink, resulted in rigid films after spin coating for several minutes. Such inks therefore required solvent-assisted imprinting, akin to patterning complete NP-based films.

The improvement in conductivity by adding sol to provide just 20 wt % ITO content from sol can be attributed to reduced porosity of the films, improved interfacial contact, and potentially superior quality of ITO from sols compared to the ITO NPs. The porosity in NP-based films arises in part from the interstitial voids between assembled NPs upon removal of the solvent, which can strongly vary with the size distribution of the NPs in the film. To compare porosity in the thin films, refractive index (RI) was measured using spectroscopic ellipsometry. RI fitting was performed by minimizing mean-square error (MSE) using a general oscillator layer model for ITO.

FIG. 6B shows the refractive index (RI) measured between 450-800 nm for 500° C. calcined 100 NP ITO, 80 NP/20 sol ITO and 100 sol ITO thin films on silicon substrates. The thicknesses of the films, RIs at 633 nm and mean square error (MSE) values are shown in Table 2. The small MSE values (less than 10) signifies good fitting of RI data. Taking the RI of dense ITO as 1.858 at 633 nm, porosities as calculated using the Lorentz-Lorenz effective medium approximation model (detailed above) are approximately 31.5% for 100 NP ITO, 28.3% for 80/20 ITO and 27.6% for 100 sol ITO films.

Planar ITO films made by NP-based ink and NP/sol-based inks showed excellent optical transparency of more than 90% in the visible range, which also suggest that there is no precipitation of large aggregates during film formation by these methods.

TABLE 2

|  | Thickness (nm) | MSE | RI at 633 nm |
| --- | --- | --- | --- |
| 100 NP ITO | 114 | 9.7 | 1.528 |
| 80 NP/20 sol ITO | 166 | 11 | 1.558 |
| 100 sol ITO | 74 | 12 | 1.564 |

Example 5

Figure 7A:
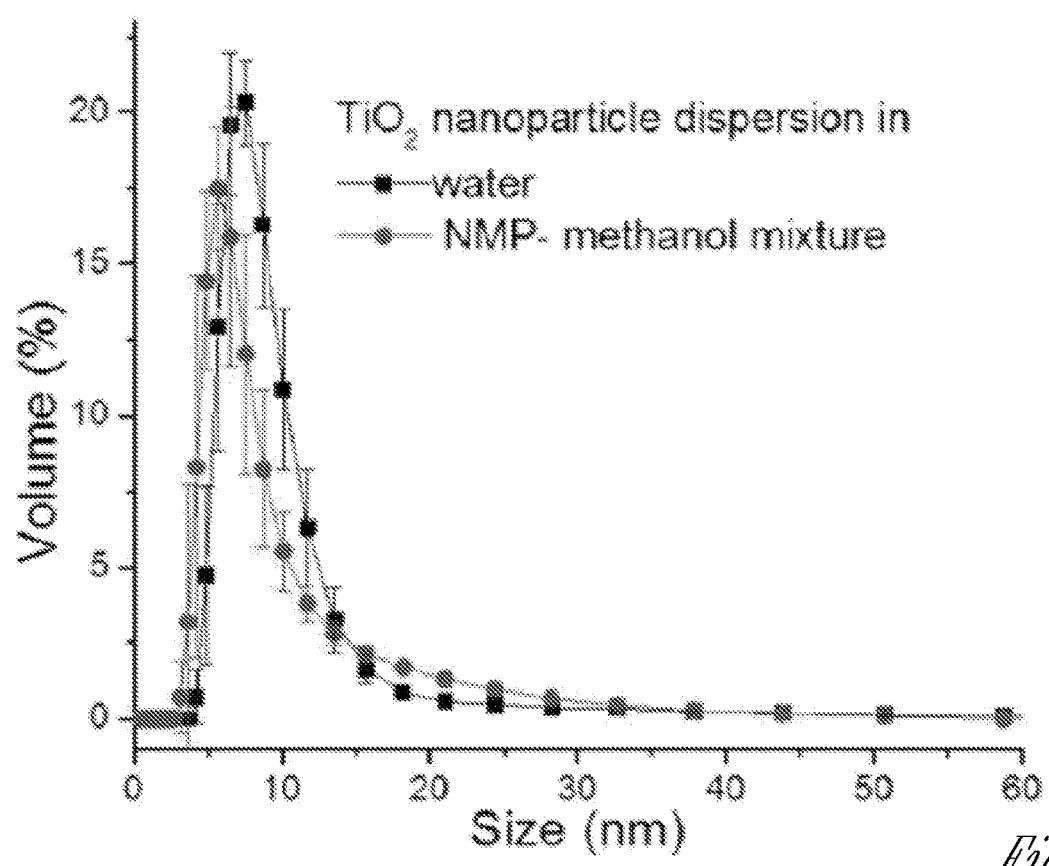
FIG. 7A shows that the size of $TiO_2$ aggregates before (8.7 nm) and after (7.9 nm) solvent change from water to n-methyl-2-pyrrolidone (NMP)-methanol mixture remains almost unchanged.
Figure 7B:
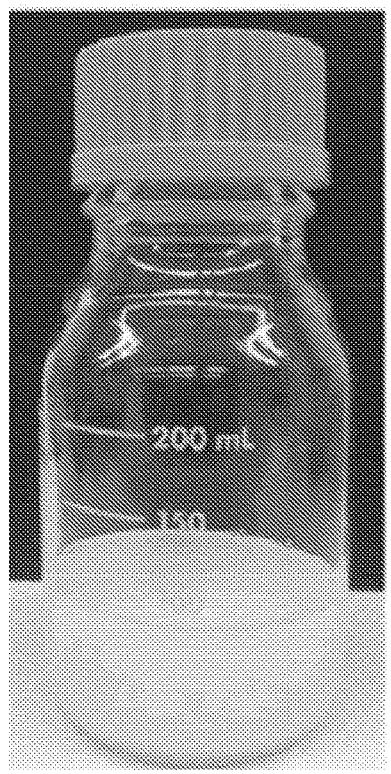
FIG. 7B shows an optical image of NP suspension in NMP-methanol mixture, which is stable for over a year with negligible precipitation.
Figure 7C:
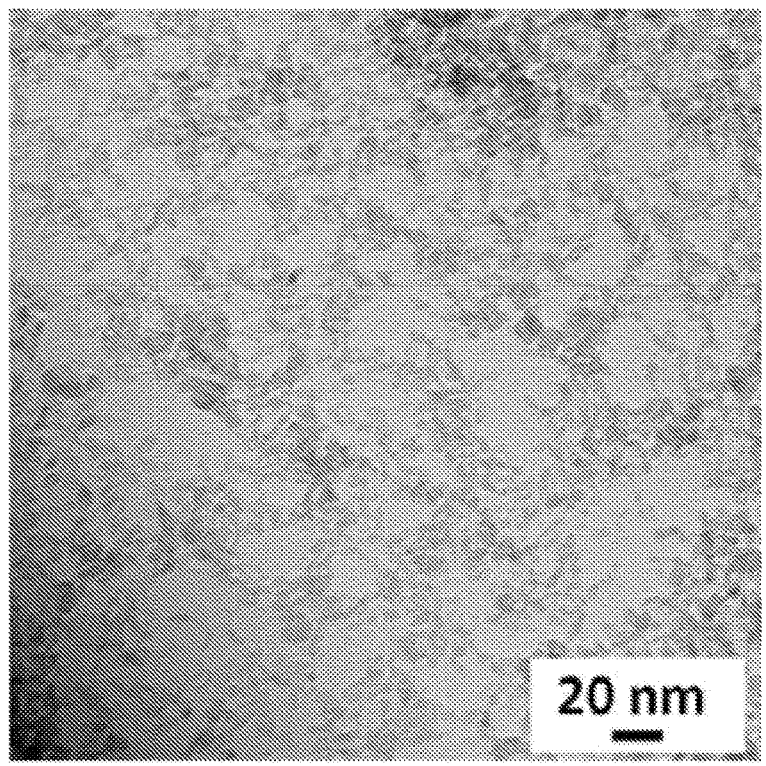
FIG. 7C shows a transmission electron microscopy (TEM) image of dropcasted $TiO_2$ nanoparticles (NPs) with the majority of particles below 8 nm.

This example demonstrates the imprinting of $TiO_2$ nanostructures. $TiO_2$ NP dispersions for inks are obtained by replacing majority of the water in commercially available acid-stabilized aqueous $TiO_2$ (anatase) NP dispersions with a NMP-methanol solvent mixture. The particle size distribution in suspensions, as shown in FIG. 7A of $TiO_2$ aggregates before (8.7 nm) and after (7.9 nm) solvent change from water to NMP-methanol mixture remained almost same. FIG. 7B shows an optical image of NP suspension in NMP-methanol mixture, which is stable for over a year with negligible precipitation. FIG. 7C shows a TEM image of drop-casted $TiO_2$ NPs with the majority of particles below 8 nm.

Titania nanostructures were imprinted with inks that comprise different proportions of $TiO_2$ NP dispersions (in NMP-methanol mixtures) and a UV-curable $TiO_2$ sol, titanium diisopropoxide bis(acetylacetonate) (TPA), in IPA. TPA is one of the most common $TiO_2$ precursor as acetylacetonate (AcAc) chelates Ti and forms a stable metal complex. AcAc or more generally β-diketonate ligands have an optical absorption band in the UV range from the $\pi$-$\pi^*$ transition. This photoexcitation of AcAc ligands gives rise to the dissociation of the chelate bonds of the metal complex increasing the reactivity of the metal precursor to form an amorphous $TiO_2$ network.

Imprinting was performed with a composite-PDMS stamp. Samples were subjected to 10 km$^{-2}$ energy dose of long wavelength UV light after placing the stamp for imprinting in order to cure TPA sol. The shrinkage in the feature height at each step during the fabrication process for 100 NP $TiO_2$, 80 NP/20 sol $TiO_2$ and 100 sol $TiO_2$ is shown in Table 3. Line height (LH) and shrinkage in feature height during imprinting and heat treatment steps for fabrication of $TiO_2$ gratings using ink composed of different proportions of $TiO_2$ NPs and UV curable TPA sol. Shrinkage observed in the LH of as-imprinted samples with respect to the LH of master mold is represented as 'shrinkage-I', and shrinkage observed in the LH of heat treated samples with respect to the LH of as-imprinted samples is represented as 'shrinkage-HT'.

TABLE 3

| | LH of master mold | LH/shrinkage-I (for as-imprinted sample) | LH/shrinkage-HT (for 500° C. heat treated sample) |
|---|---|---|---|
| 100 NP $TiO_2$ | 480 nm | 385 nm/20% | 360 nm/6% |
| 80 NP/20 sol $TiO_2$ | 480 nm | 380 nm/21% | 340 nm/11% |
| 100 sol $TiO_2$ | 480 nm | 270 nm/44% | 140 nm/48% |

$TiO_2$ due to its high RI and transparency is interesting for applications in photonic devices to manipulate visible light. The thicknesses of the films, MSE values, RIs at 633 nm are shown in Table 4. Taking the RI of dense $TiO_2$ as 2.49 at 633 nm, porosities as calculated using Lorentz-Lorenz effective medium approximation model are 23.3% in 100 NP $TiO_2$ film, 25.6% in 80 NP/20 sol $TiO_2$ film and 18.5% for 100 sol $TiO_2$ film. Unlike in case of ITO, the RI of $TiO_2$ NP films did not improve by addition of the sol. Without being limited to theory, this potentially could be due to the alteration in surface charge on $TiO_2$ NPs in the presence of TPA sol, leading to changes in coagulation dynamics during drying of the film. It is believed that the RI in NP based films can be further improved by choosing a dispersion with broader particle size distribution.

TABLE 4

| | Thickness (nm) | MSE | RI at 633 nm |
|---|---|---|---|
| 100 NP $TiO_2$ | 86 | 7 | 1.960 |
| 80 NP/20 sol $TiO_2$ | 103 | 17 | 1.917 |
| 100 sol $TiO_2$ | 70 | 9 | 2.056 |

The method disclosed herein has numerous advantages, at least some of which are unexpected. According to various embodiments, the method can be used to manufacture free-standing features without a residual layer. According to various embodiments, by taking the advantage of low surface energy of the stamp, ink solutions with low viscosity and appropriate advancing and receding contact angles on the stamp material, the method can be used to fill recesses in the stamp without leaving any residue on the surface. According to various embodiments, such discontinuous wetting approach has been used to fill various elastomeric stamps with metal oxide sols, followed by imprinting on the substrate to achieve a residual-layer free pattern.

According to various embodiments, in addition to discontinuous wetting of the stamp, residual-layer free direct imprinting can be facilitated by application of modest pressure to squeeze-out low viscosity inks from between the stamp/substrate interface during the imprinting process. According to various embodiments, imprinting of gold features with minimal residual layers is optimized using a low viscosity and low surface tension gold NP suspension in α-terpineol at a 5 psi imprint pressure.

The ink comprises a ~3 wt % $TiO_2$ NP dispersion in propanediol-methanol solvent mixture, obtained by diluting 20 wt % $TiO_2$ NP stock dispersion in propanediol with methanol. The ink was spin-coated (at 3,000 RPM) onto a silicon wafer in a 70-80% relative humidity environment for about 2 minutes after which a PDMS stamp (LW, ~475 nm; LP, ~950 nm; LH, ~480 nm) was placed and light pressure applied. The substrate was then heated to 120° C. for 15 seconds and the stamp was removed to obtain residual-layer free line pattern with ~300 nm line height. In this case, high relative humidity was found to be important to obtain high quality residual-layer free imprints. High humidity leads to thinner NP-based films suggesting that the interaction of ink with substrate is weaker at higher humidity, which will promote dewetting of the ink at the stamp/substrate interface during the imprinting process.

Example 6

Figure 8:
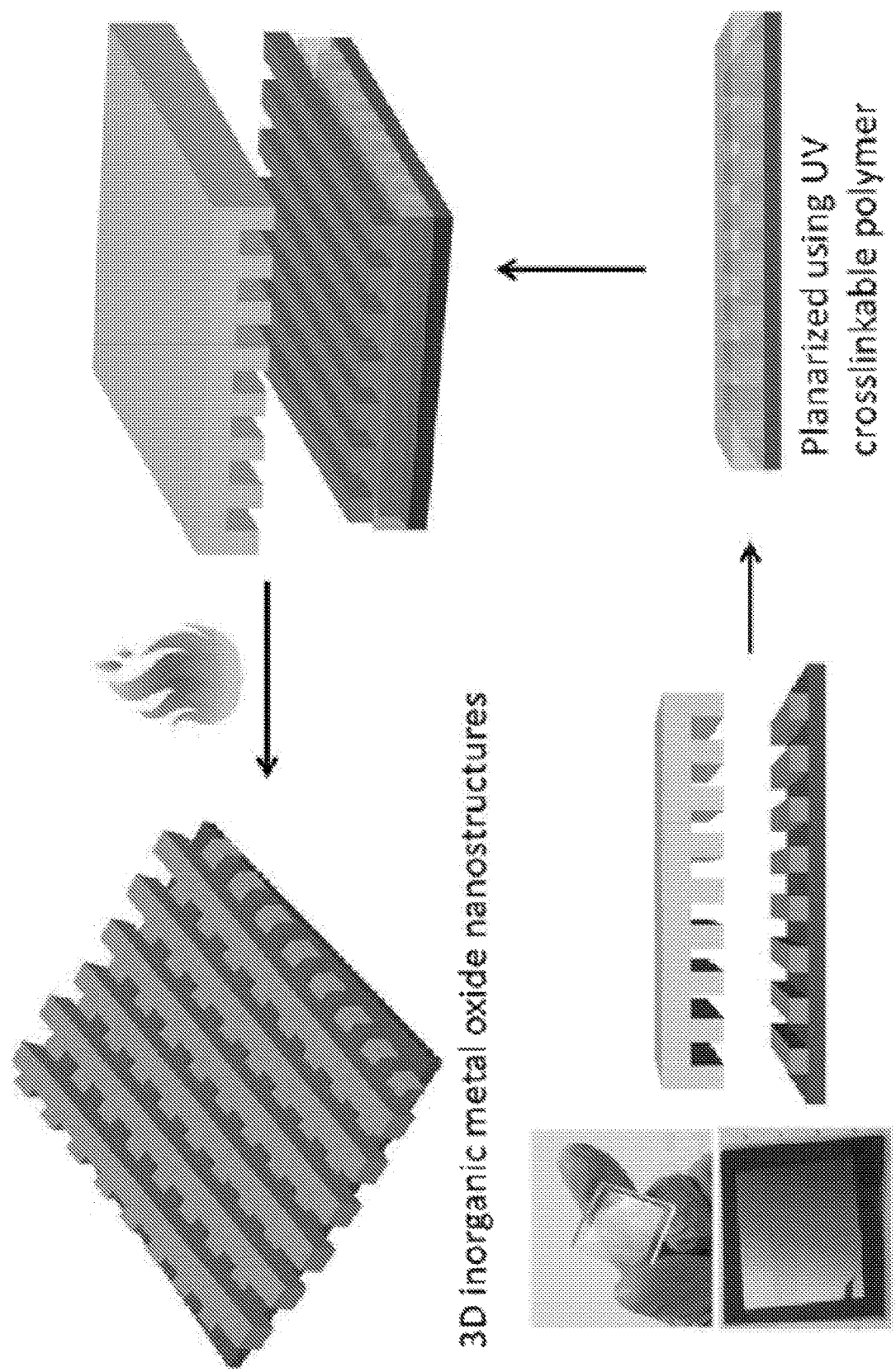
FIG. 8 depicts a method for manufacturing 3-D nanostructures using a simple print-planarize-print approach.

The ability to print NP-based features with minimal residual layers enables the fabrication of completely inorganic continuous 3-D nanostructures using a simple print-planarize-print approach. The FIG. 8 depicts a method for manufacturing 3-D nanostructures using a simple print-planarize-print approach.

The first grating layer on a silicon wafer is imprinted using ~3 wt % $TiO_2$ NPs dispersion in propanediol-methanol solvent mixture as ink and a PDMS stamp (LW, ~475 nm; LP, ~950 nm; LH, ~480 nm) in 60-80% relative humidity environment. Imprinting time is 10 seconds at 120° C.

The height of the imprinted line can be tuned between 250-300 nm by simply varying spin speed (2,000-3,000 RPM) or the concentration of the ink. In the second step the structure is planarized with a UV-crosslinkable low viscosity organic thiolene-acrylate prepolymer (NOA60, Norland Products Inc.) by spin-coating from a 20 wt % NOA60 solution in propylene glycol monomethyl ether acetate (PG-MEA) solvent followed 10 wt % NOA60 solution in PGMEA, with UV curing after each spin coating step. A low power oxygen plasma treatment before coating each planarization layer is found to improve of the quality of planarization layer. The low viscosity of NOA60 allows effective planarization (grating height reduce to 2-5 nm as measured by AFM) while leaving a thin residual layer (100-150 nm) atop of the first grating structure.

Figure 9A:
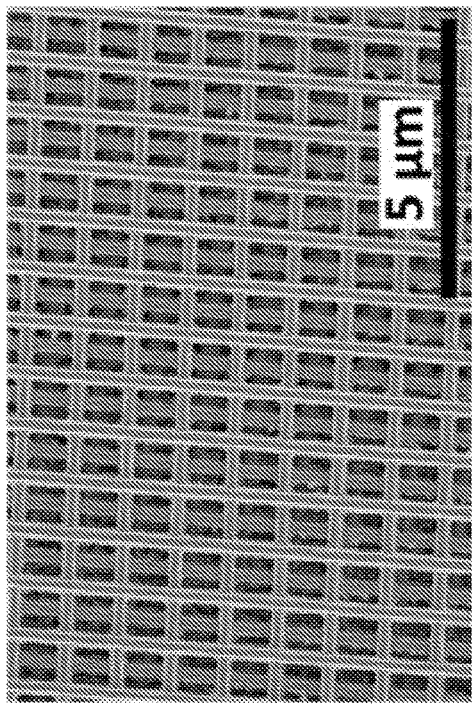
FIG. 9A shows a bilayer with ~240 nm grating-width at the top of the grating line following calcination to remove the planarization layer.
Figure 9B:
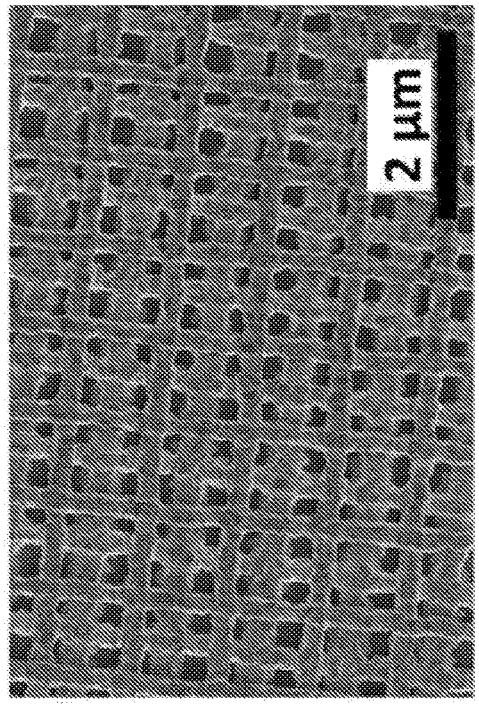
FIG. 9B shows a tetralayer with ~240 nm grating-width at the top of the grating line following calcination to remove the planarization layer.
Figure 9C:
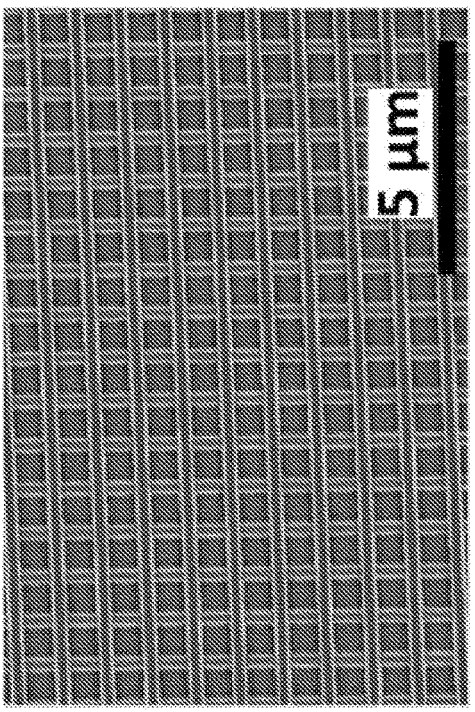
FIG. 9C shows the bilayer after annealing at 850° C. for 1 h with grating width reduced to ~200 nm.
Figure 9D:
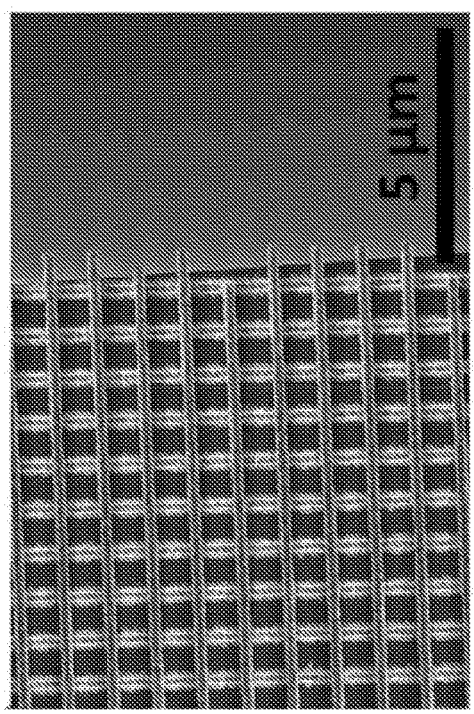
FIG. 9D shows the tetralayer after calcination at 1000° C. for 1 hour with x-ray diffraction (XRD) suggesting highly crystalline rutile morphology with sharp higher order peaks.

The imprinting and planarization process is then simply repeated for the desired number of layers. Finally, the organic planarization layer is removed by calcination. FIGS. 9A and 9B show a bilayer and a tetralayer with ~240 nm grating-width at the top of the grating line following calcination to remove the planarization layer. FIG. 9C shows the bilayer after annealing at 850° C. for 1 hour with grating width reduced to ~200 nm. The structure remains stable despite conversion of $TiO_2$ from anatase to rutile and significant coarsening of the NP crystallites, as indicated by sharp primary rutile-peak in XRD. FIG. 9D shows the tetralayer after calcination at 1000° C. for 1 hour with XRD suggesting highly crystalline rutile morphology with sharp higher order peaks. A slight sagging of the structure can be observed due to softening of $TiO_2$ at such high temperature.

Continuous 3-D inorganic nanostructures using direct imprinting methods to stack residual-free patterned layers have been demonstrated in the past by transfer stacking patterned precursor layer on to a pre-patterned substrate and by transfer imprinting ink filled in a soft mold recesses on to a pre-patterned substrate. The drawback of the conventional transfer stacking method is that it used the conventional thermal NIL technique for patterning, which involved a hard master mold to imprint into palladium organic ink at high processing pressure (50 bar). The excessive pressure used during imprinting and transferring caused cracking of stacked grating lines in some cases. The imprinted line pattern also suffered a massive line height reduction of 62% upon calcination due to the high organic content of the ink. Moreover, instead of appearing as a 3-D structure, the bilayer structure resembled a 2-D structure because of collapse of the soft metal organic ink pattern during heat treatment step. Bilayers generated by directly transfer imprinting silver NP ink filled in soft mold recesses on to a pre-patterned substrate also suffered from structural instability were the top layer collapsed and touched the substrate, probably due to sagging of the soft mold features during the imprinting step. In contrast to this, our multilayer structures do not collapse upon heating up to 850° C. (FIGS. 9A-9C) because of the rigidity and robustness of as-imprinted grating layers. Moreover, our approach enables the fabrication of many layers.

Example 7

This example demonstrates fabrication of subsequent imprints using a hard master mold.

A zirconia hard master mold is used to imprint a texture in PMMA (polymethylmethacrylate) disposed on a polyester (polyethylene terephthalate (PET)) substrate. The PMMA nanostructures formed using thermal embossing or UV-NIL.

Figure 10C:
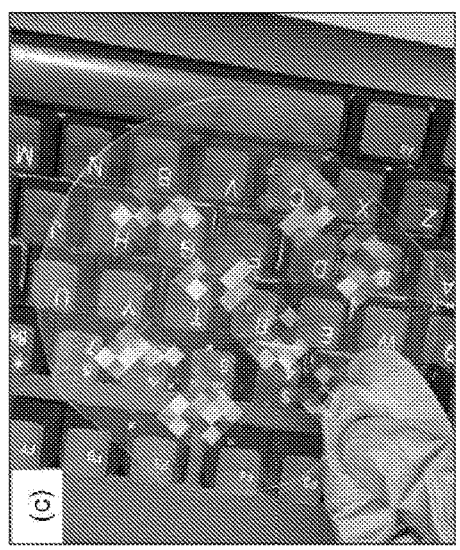
FIG. 10C shows poly(methyl methacrylate) (PMMA) inverse structures of $ZrO_2$ master on polyethylene terephthalate (PET) substrate.
Figure 10B:
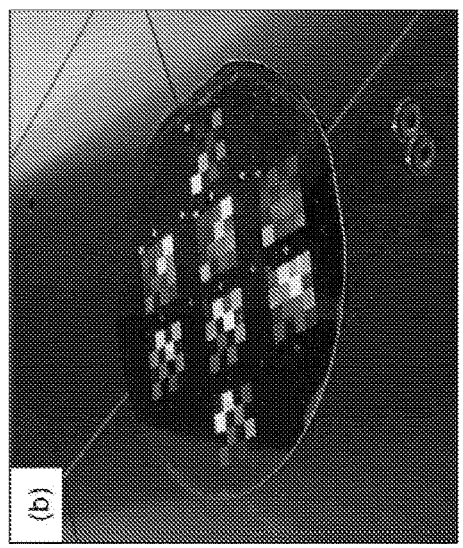
FIG. 10B shows a $ZrO_2$ master mold on Si wafer.
Figure 10A:
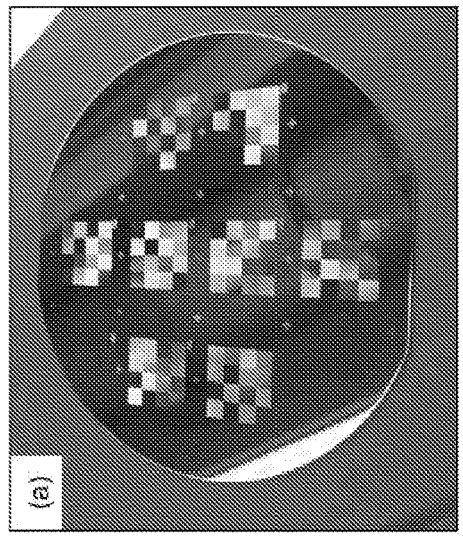
FIG. 10A shows a Si master mold.
Figure 12A:
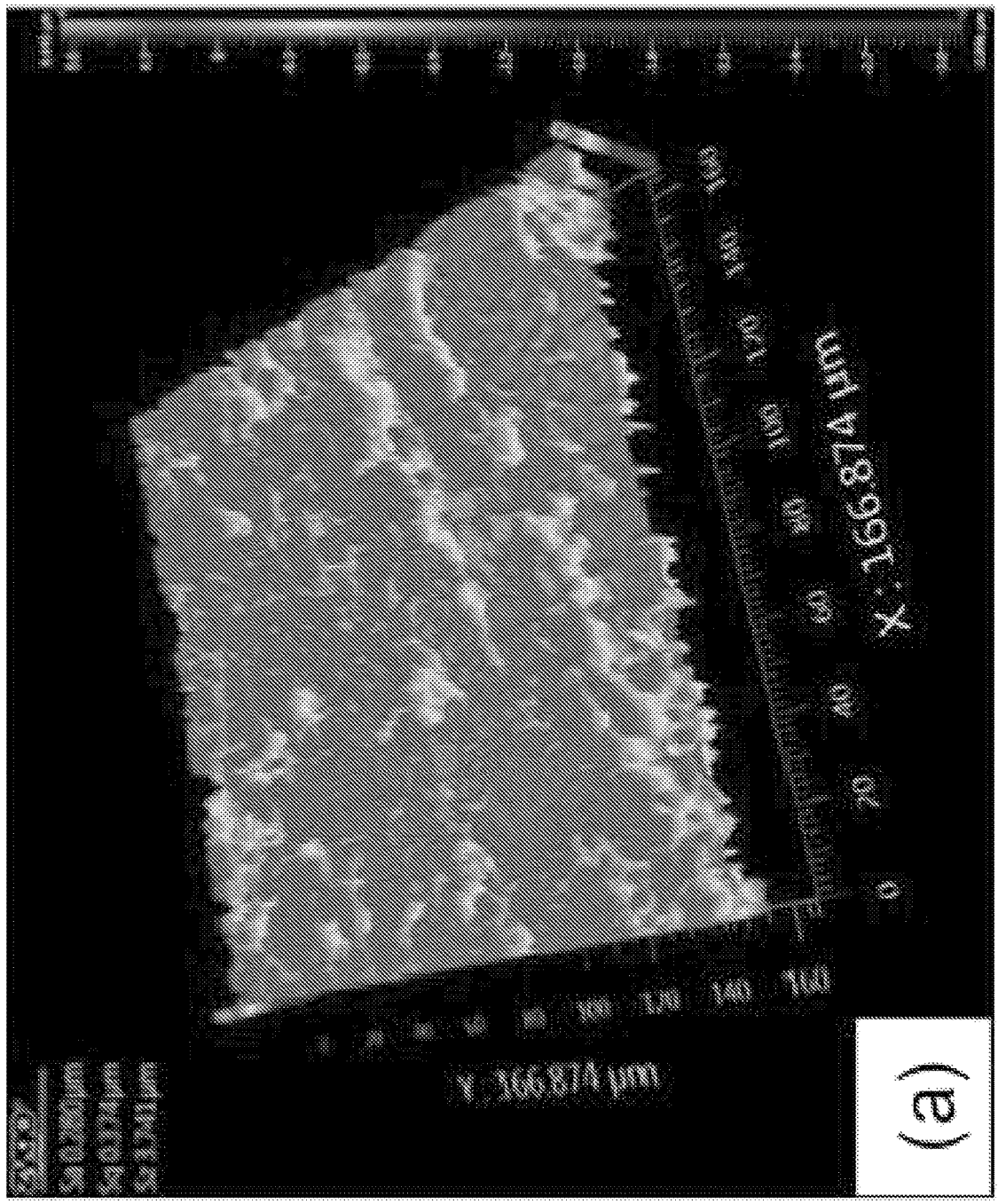
FIG. 12A depicts a surface profile image of a steel surface.
Figure 12B:
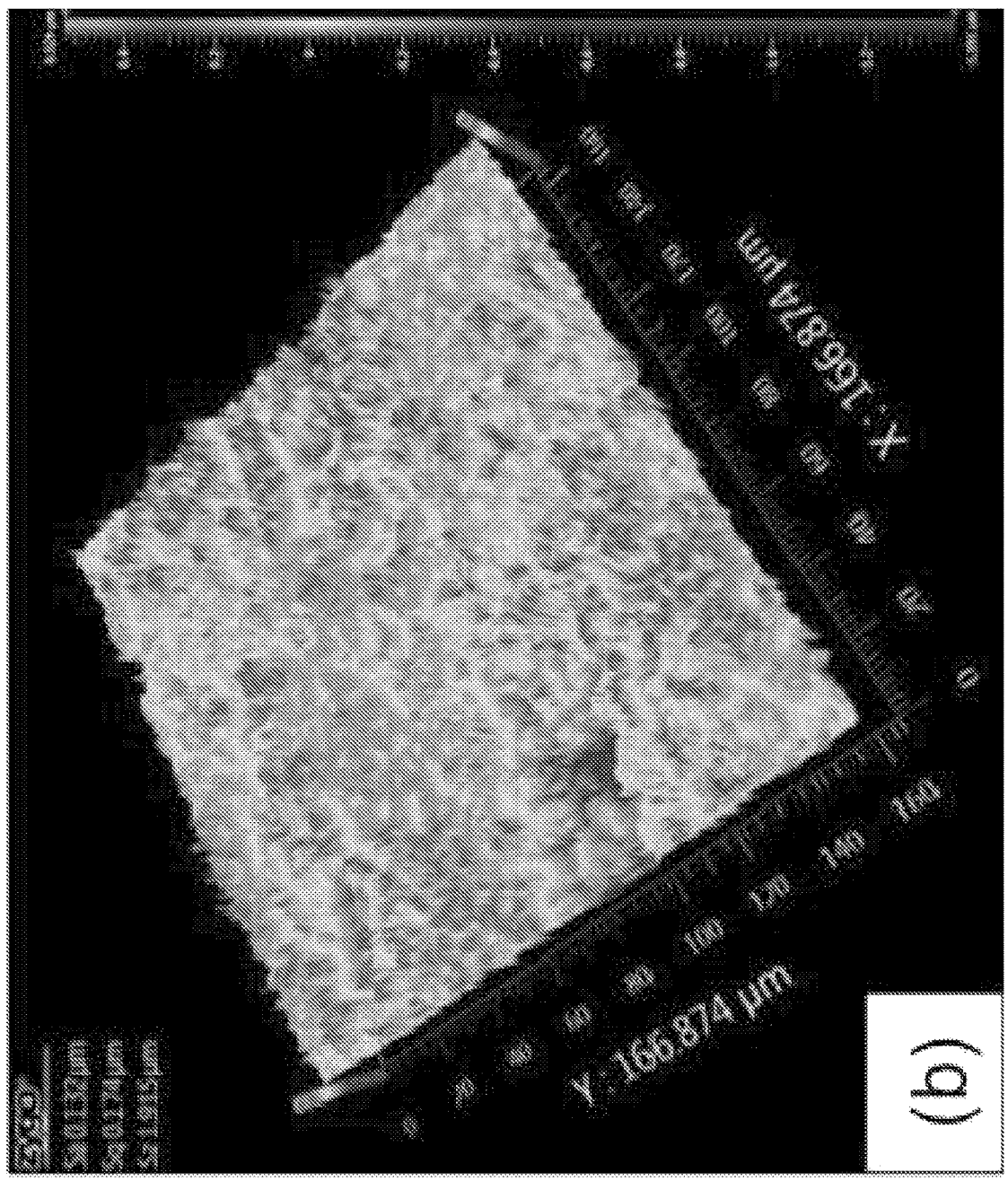
FIG. 12B depicts a surface profile image after a $1^{st}$ coating layer on the steel.
Figure 12C:
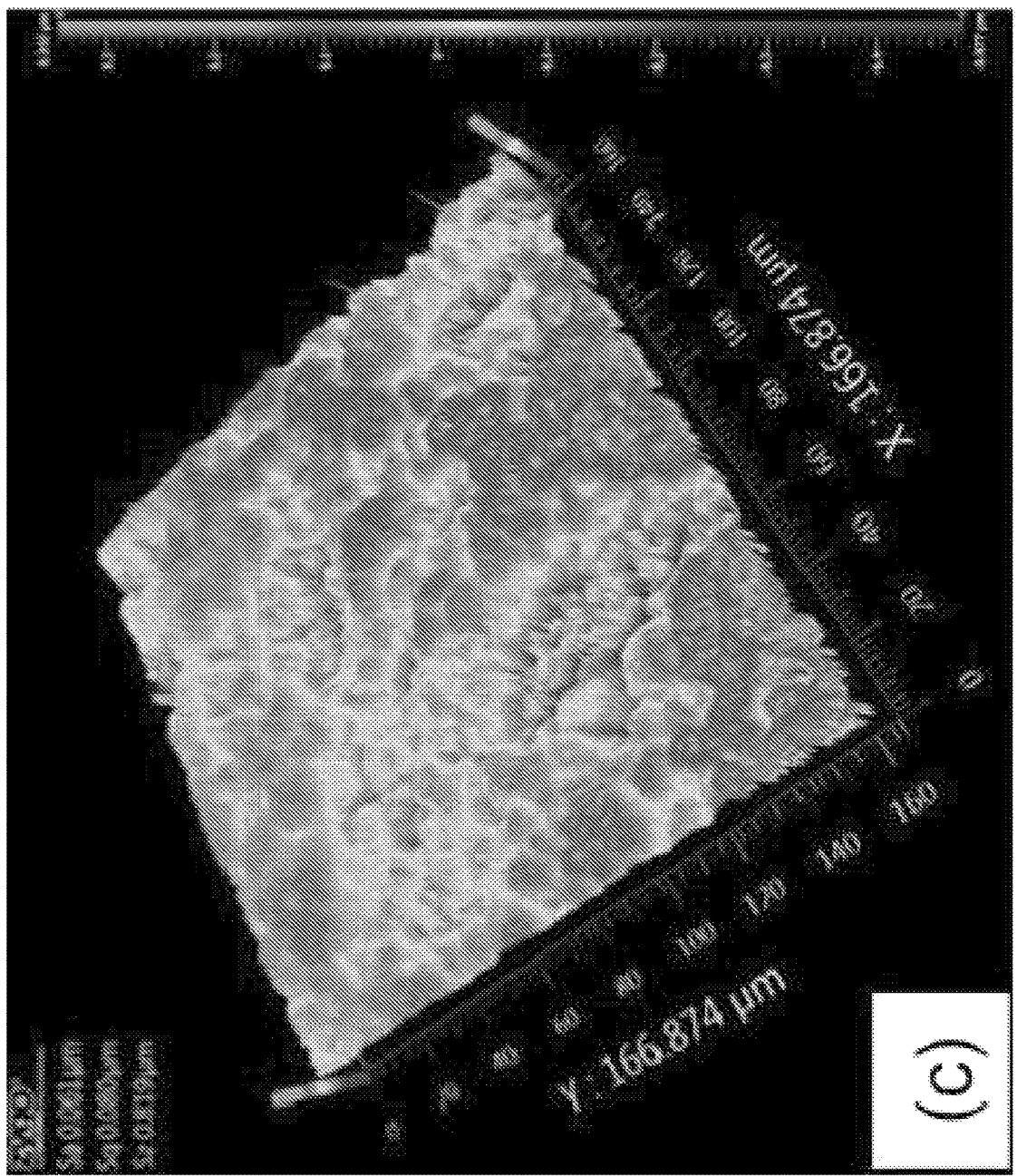
FIG. 12C depicts a surface profile image after a $2^{nd}$ coating layer on the steel.
Figure 12D:
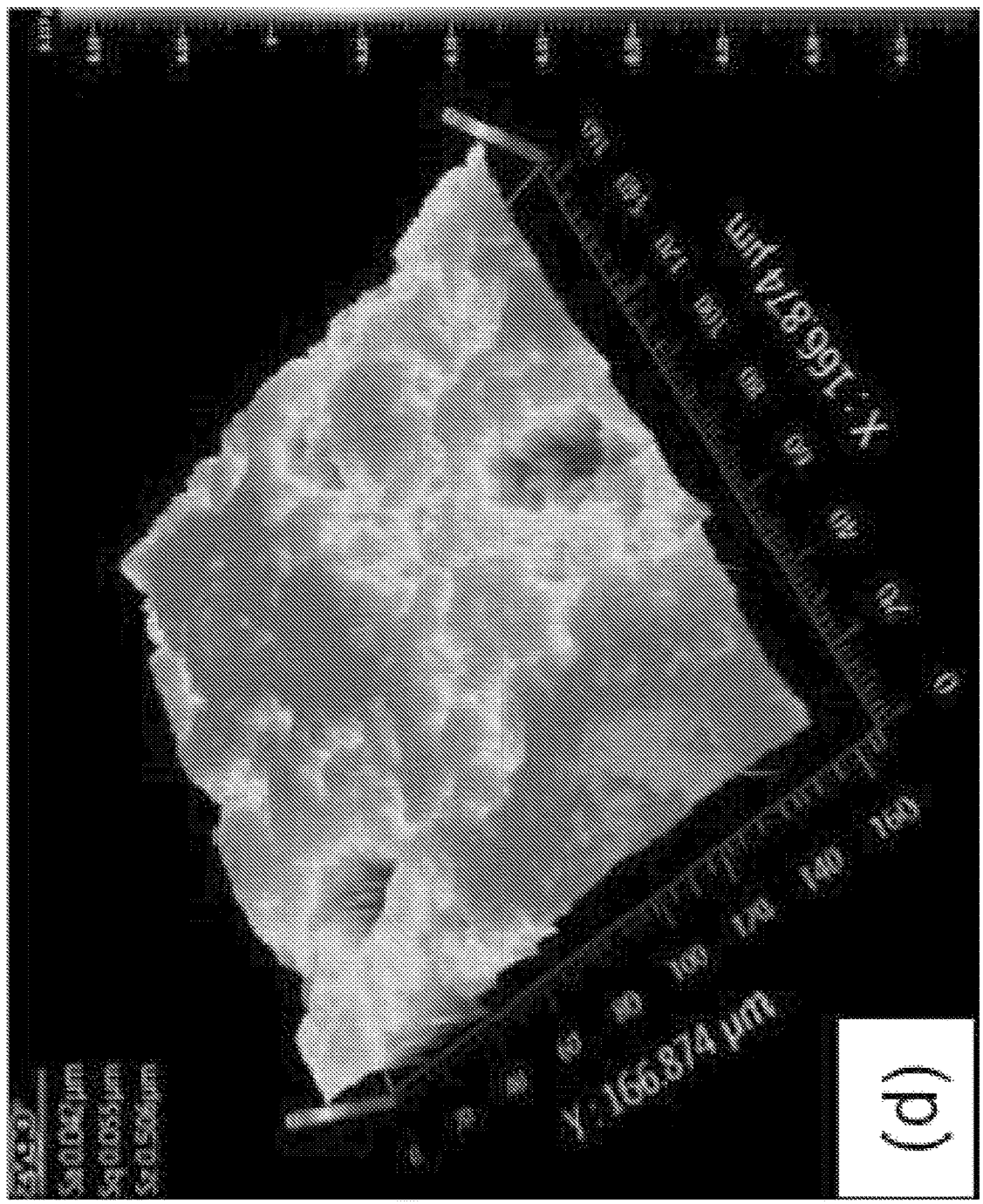
FIG. 12D depicts a surface profile image after $3^{rd}$ coating layer on the steel.
Figure 12E:
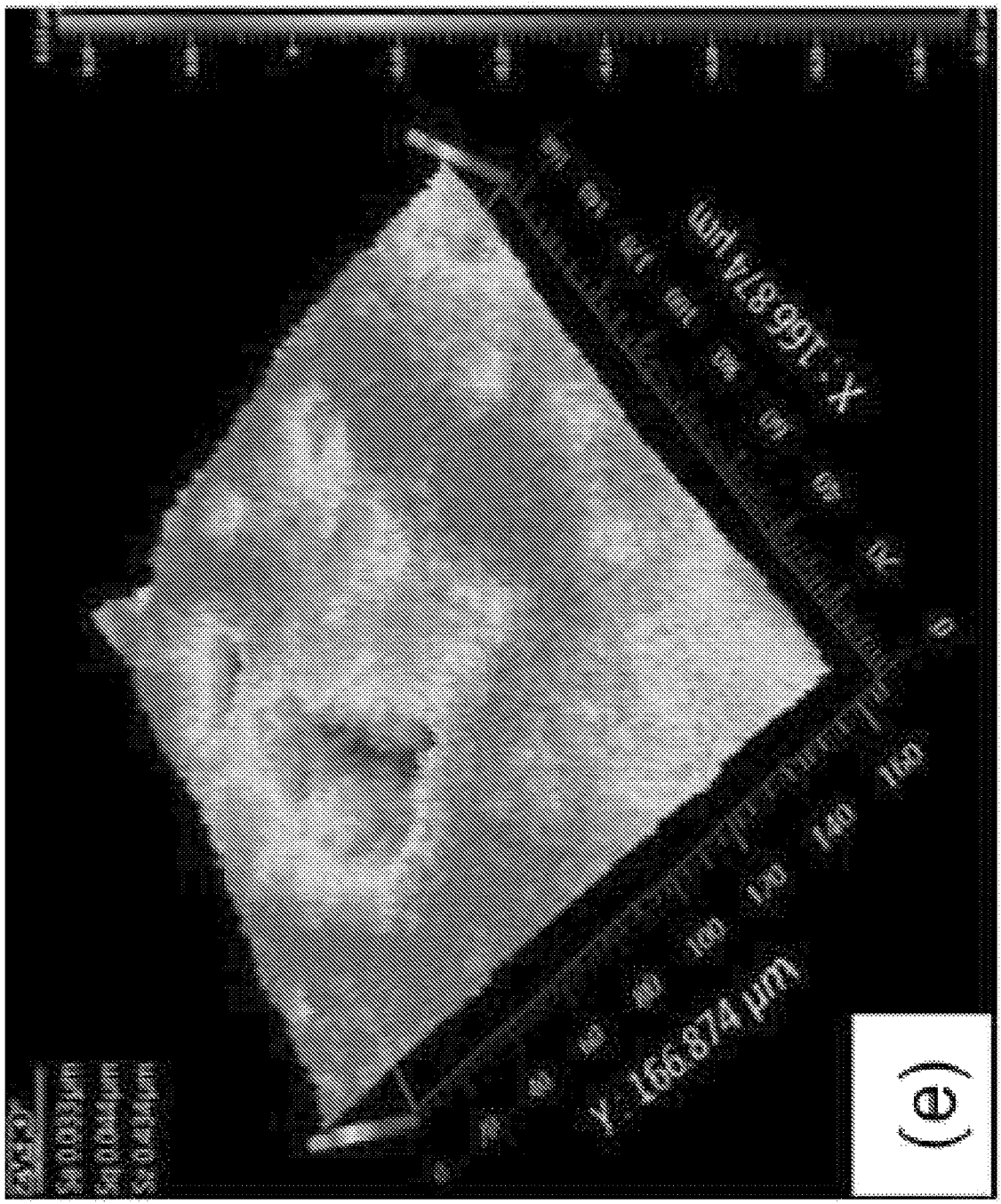
FIG. 12E depicts a surface profile image after a $4^{th}$ coating layer on the steel.

The $ZrO_2$ hard master was used for both thermal and UV-NIL and, obtained PMMA and NOA nanostructured replicates on PET substrates, respectively (see FIGS. 10A-C and 11). FIG. 10A-C show images of (a) Si master mold (b) $ZrO_2$ master mold on Si wafer (c) PMMA inverse structures of $ZrO_2$ master on PET substrate, respectively.

There was no measurable difference in the quality of the obtained inverse nanostructure and also $ZrO_2$ master after 30 consecutive imprints using the same $ZrO_2$ master (see FIG. 11A-F). In this way, it has been demonstrated that these $ZrO_2$ structures have a high strength and durability, making them ideal for uses a master mold. FIG. 11A-F show scanning electron microscope (SEM) images of (a) patterned metal oxide nanoparticles on Si wafer by using solution assisted soft NIL; (b) inverse PMMA structures by using hard metal oxide mold via thermal NIL; (c) the same metal oxide mold after 15 consecutive imprint; (d) inverse PMMA structures as $15^{th}$ replica; (e) the same metal oxide mold after 30 consecutive imprint; and (f) inverse PMMA structures as $30^{th}$ replica, respectively.

Example 8

This example demonstrates that rough surfaces can be efficiently planarized using layer-by-layer coating with metal oxide nanoparticles and they can be used as a substrate for hard master fabrication.

This example demonstrates the use of steel substrates to imprint nanostructures. Due to rough nature of steel substrates, it is more challenging to imprint nanostructures compared to microstructures directly onto the steel. Planarization of the steel was performed with metal oxide nanoparticles using a solution deposition technique.

A $ZrO_2$ nanoparticle solution was spin coated onto the steel substrate as a thin layer, and after complete solvent removal it was sintered at 350-500° C. The same procedure was repeated on the same steel via layer by layer coating until the roughness was sufficiently reduced. It is possible to decrease surface roughness $S_a$ from ~300 nm to ~30 nm and $S_z$ from ~3.7 μm to ~0.4 μm after 3-4 coats (see FIG. 12A-E).

FIG. 12A-E depict surface profile images of (a) a steel surface; (b) after $1^{st}$ coating layer on the steel; (c) after $2^{nd}$ coating layer on the steel; (d) after $3^{rd}$ coating layer on the steel; and (e) after $4^{th}$ coating layer on the steel, respectively. Rough surfaces can be therefore be efficiently planarized by layer by layer coating with metal oxide nanoparticles and they can be used as a substrate for hard master fabrication.

Example 9

This example replicates the patterns from a Si master and obtained a $ZrO_2$ master mold on a Kapton film. A $ZrO_2$ master mold was annealed at 300° C. to obtain a hard and durable coating. Annealing temperature were adjusted according to the substrate material. Light sintering (microwave, NIR, and the like) may be used for flexible substrates too. The $ZrO_2$ hard master was used for thermal NIL on a PMMA coating disposed on a PET substrate. There was no measurable difference in the quality of the obtained inverse nanostructure and the $ZrO_2$ master. Thus, the flexible metal oxide master molds can be used for injection molding, roll to roll embossing, UV-NIL, holography, and the like. It allows for low cost, mass production of micro and nano-structured surfaces for variety of application (structural colors, antimicrobial surfaces, low friction surfaces, etc.).

Example 10

This example demonstrates the preparation of a metal oxide master and the imprinting with the metal oxide master.
Preparation of $ZrO_2$ Master:

A 50 wt % $ZrO_2$ nanoparticle solution was diluted to 10-20 wt % of the nanoparticles with ethanol and 1,2 propanadiol. The mixture was sonicated for 15 minutes to have a well dispersed solution and filtered with a syringe filter before using it. Stainless steel substrates were cleaned with hexane, acetone and IPA respectively and an 02 plasma was conducted for 5 to 10 minutes. The $ZrO_2$ solution was spin coated on the steel substrate and then a PDMS mold was placed on the top of coating. The substrate with the top coating (now patterned by the PDMS) was placed on a hot plate in order to get rid of all residual solvent. Then PDMS was peeled off and the patterned structure were obtained on the steel substrate. The patterned structure was annealed at 500° C. for 2 hours. The annealed patterned surface was fluorinated in order to reduce sticking during the manufacturing of the next imprints. The same procedure was conducted on a glass substrate. At the end, a $ZrO_2$ master was obtained on the glass and the steel for the next imprints.
Imprints from $ZrO_2$ Masters Poly (methyl methacrylate) (PMMA, 199 k g/mol) was dispersed in anisole in an amount of 15 wt % and spin coated on PET substrate. The $ZrO_2$ master was placed on the top of the PMMA coating and thermal imprint was done at 140° C. for 2 minutes. The PET substrate was peeled of easily and inverse pattern structure was obtained. The patterns were characterized by SEM and optical profilometer. Both of them showed the PMMA conformed the $ZrO_2$ mold shape without having defects.

For UV imprints, a UV-curable Norland Optical Adhesive (NOA60) was used. The NOA was spin coated on PET substrate and the $ZrO_2$ master was placed on the top of coating. Then, it was cured under 365 nm UV light for 5-10 min. The PET was peeled off from the glass and conformed the mold shape.

Mechanical Properties of Hard $ZrO_2$ Coating

Nano-indentation was done on smooth $ZrO_2$ coatings to characterize the hardness of coatings. After annealing, the nano-indentation hardness increased up to 3-5 GPa, which provides the mold with the ability to be repeatedly used.

Example 11

Micro/Nanopatterned Stainless Steel Using $ZrO_2$ Master

Figure 13A:
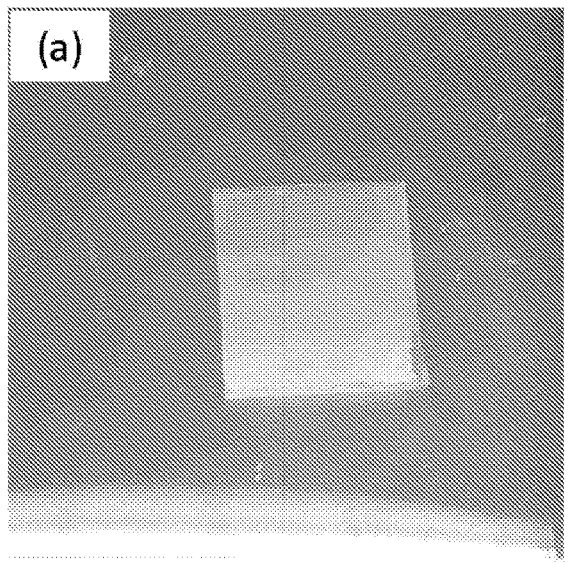
FIG. 13A shows a metal oxide nanoparticle imprint on zirconia substrate for subsequent imprints.
Figure 13B:
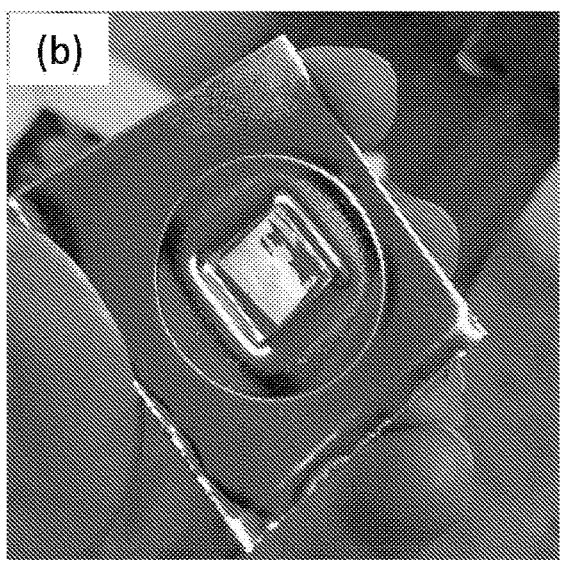
FIG. 13B shows nanopatterned steel using a metal oxide patterned mold.

In this example, the $ZrO_2$ nanoparticle solution was spin coated on a variety of substrates (zirconium, steel, etc.) and the PDMS mold was placed on top. After drying, the PDMS mold was peeled off from the substrate leaving behind patterned $ZrO_2$ structures. The $ZrO_2$ patterned film was annealed at various temperatures (500° C.-1000° C.) to obtain a hard coating, which could be used as a master for future imprints. The $ZrO_2$ hard mold was placed on top of stainless steel and the pattern was transferred into the steel using a hydraulic press at various pressures (see FIGS. 13A and 13B). This way, nanopatterned embossed steel can be fabricated at a very low cost compared to current techniques, such as laser milling, ion beam etching, and so on. Instead of using a hydraulic press, one could also use a roller to transfer the pattern into the steel. Moreover, pattern transfer can be done not only into steel, but also into softer metals such as copper, aluminum, nickel, and so on.

Example 12

Figure 14A:
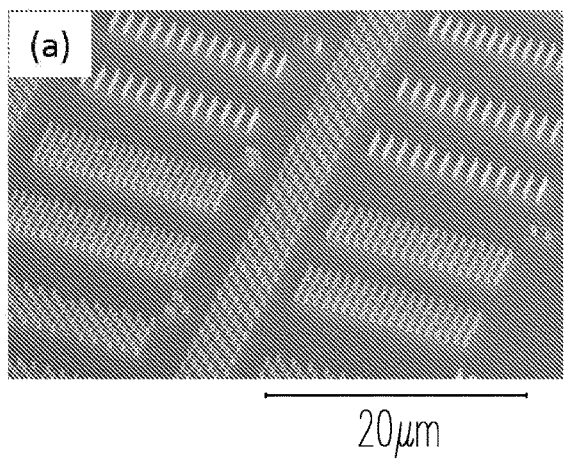
FIG. 14A shows a scanning electron microscope (SEM) image of (a) patterned metal oxide nanoparticle structures.
Figure 14B:
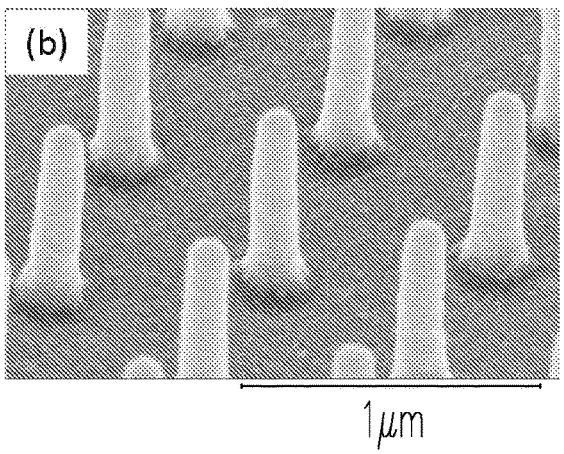
FIG. 14B shows a SEM image of high aspect ratio metal oxide pillar structures.

This example demonstrates the preparation of a metal oxide master which has a high aspect ratio nanopatterns.
Nanopatterned High Aspect Ratio Structures High aspect ratio patterned structures have been used in optical devices, such as for superlenses. In this example, a metal oxide nanoparticle solution was mixed with 10 wt % tetraethyl orthosilicate and spin-coated on a substrate and the PDMS mold was placed on top. Near IR curing was conducted before peeling off the PDMS. After this, pillar structures were obtained in metal oxide. Hard metal oxide pillars were fabricated with aspect ratios from 4:1 to 5:1 (see FIGS. 14A and 14B). These structures can be used as a master mold to obtain future imprints in polymers, glass, and metals. For example, one can fabricate high aspect ratio holes, slanted structures, and so on in $ZrO_2$ and use it as a master mold to produce the inverse replica using thermal embossing, UV-NIL, and injection molding.

The mold detailed herein may be used to produce a variety of textured surfaces that can be used for controlling surface energy, adhesion characteristics, frictional characteristics, color, surface appearance, optical performance, organism growth, and the like.

While the invention has been described with reference to some embodiments, it will be understood by those skilled in the art that various changes may be made and equivalents may be substituted for elements thereof without departing from the scope of the invention. In addition, many modifications may be made to adapt a particular situation or material to the teachings of the invention without departing from essential scope thereof. Therefore, it is intended that the invention not be limited to the particular embodiments disclosed as the best mode contemplated for carrying out this invention, but that the invention will include all embodiments falling within the scope of the appended claims.

Additional Embodiments

The following exemplary embodiments are provided, the numbering of which is not to be construed as designating levels of importance:

Embodiment 1 provides a method comprising:
disposing upon a first substrate, a first coating;
texturing the first coating with a stamp;
treating the textured first coating to form a master mold; where the master mold contains a mirror image of the texture contained in the first coating; and
transferring the texture from the master mold to a second substrate.

Embodiment 2 provides the method according to Embodiment 1, where the second substrate comprises a second coating disposed thereon.

Embodiment 3 provides the method according to any one of Embodiments 1-2, where the first coating comprises 10 to 50 wt % of a sol-gel.

Embodiment 4 provides the method according to any one of Embodiments 1-3, where the stamp comprises a polymer.

Embodiment 5 provides the method according to any one of Embodiments 1-4, where the polymer comprises a polysiloxane.

Embodiment 6 provides the method according to any one of Embodiments 1-5, where the textured first coating comprises architectural elements having an aspect ratio of greater than 5:1.

Embodiment 7 provides the method according to any one of Embodiments 1-6, where the first coating comprises nanoparticles having an average particle size of less than 100 nanometers.

Embodiment 8 provides the method according to any one of Embodiments 1-7, where the first coating further comprises a metal oxide precursor sol.

Embodiment 9 provides the method according to any one of Embodiments 1-7, where the nanoparticles comprise titania, silica, zirconia, ceria, indium titanium oxide, tin oxide, indium oxide, antimony oxide, or a combination thereof.

Embodiment 10 provides the method according to any one of Embodiments 1-8, where the metal oxide precursors are metal alkoxides; where the metal alkoxides are titanium isopropoxide, titanium butoxide, tetraethoxysilane, tetramethoxysilane, vinyltrialoxysilanes, vinyltrimethoxysilane, aluminum sec-butoxide, zirconium isopropoxide, cerium isopropoxide, acetylacetonate titanate chelate, triethanolamine titanate chelate, lactic acid titanate chelate, zirconate chelates, zirconium propionate, or a combination thereof.

Embodiment 11 provides the method according to any one of Embodiments 1-10, further comprising treating the textured first coating with electromagnetic radiation; where the electromagnetic radiation comprises at least one of heat at 200 to 2000° C., microwave radiation, near infrared radiation, ultraviolet radiation, and an electron beam.

Embodiment 12 provides the method according to any one of Embodiments 1-11, where the stamp is operative to extract a portion of solvent from the first coating and where the stamp comprises polydimethylsiloxane.

Embodiment 13 provides the method according to any one of Embodiments 1-11, where the elastomeric stamp is operative to extract a portion of solvent from the first coating and comprises a polysiloxane, a polybutadiene, a polyisoprene, a styrene-butadiene rubber, a poly(styrene)-block-poly(butadiene), a poly(acrylonitrile)-block-poly(styrene)-block-poly(butadiene) (ABS), a polychloroprene, an epichlorohydrin rubber, a polyacrylic rubber, a fluorosilicone elastomer, a fluoroelastomer, a perfluoroelastomer, a polyether block amides (PEBA), a chlorosulfonated polyethylene, an ethylene propylene diene rubber (EPR), a ethylene-vinyl acetate elastomer, or a combination thereof.

Embodiment 14 provides the method according to of Embodiment 13, where the substrate comprises a metal, a polymer or a ceramic.

Embodiment 15 provides the method according to any one of Embodiments 1-14, where the metal comprises steel, brass, bronze, nickel, iron, aluminum, titanium, copper, cobalt, or a combination thereof where the polymeric substrates comprise polyolefins, polysiloxanes, polyfluoroethylenes, polyacrylates, polystyrenes, polyimides, polyesters, or a combination thereof where the ceramic substrates comprise silica, alumina, titania, quartz, zirconia, ceria, or a combination thereof.

Embodiment 16 provides the method according to any one of Embodiments 1-15, wherein the substrate is flexible or semi-flexible Embodiment 17 provides the method according to any one of Embodiments 1-16, where the second coating comprises thermoplastic polymers, thermosetting polymers, blends of thermoplastic polymers, blends of thermosetting polymers, and blends of thermoplastic polymers with thermosetting polymers and where the polymers are selected from the group of polyacetals, polyacrylics, polycarbonates polystyrenes, polyesters, polyamides, polyamideimides, polyarylates, polyacrylates, polymethylmethacrylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyoxadiazoles, polybenzothiazinophenothiazines, polybenzothiazoles, polypyrazinoquinoxalines, polypyromellitimides, polyquinoxalines, polybenzimidazoles, polyoxindoles, polyoxoisoindolines, polydioxoisoindolines, polytriazines, polypyridazines, polypiperazines, polypyridines, polypiperidines, polytriazoles, polypyrazoles, polypyrrolidines, polycarboranes, polyoxabicyclononanes, polydibenzofurans, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, polysiloxanes, polyolefins, polyacrylamides, epoxy polymers, unsaturated polyester polymers, polyimide polymers, bismaleimide polymers, bismaleimide triazine polymers, cyanate ester polymers, vinyl polymers, benzoxazine polymers, benzocyclobutene polymers, acrylics, alkyds, phenol-formaldehyde polymers, novolacs, resoles, melamine-formaldehyde polymers, urea-formaldehyde polymers, hydroxymethylfurans, isocyanates, unsaturated polyesterimides, or a combination thereof.

Embodiment 18 provides the method according to any one of Embodiments 1-17, further comprising solidifying the second coating.

Embodiment 19 provides the method according to any one of Embodiments 1-18, where the second coating comprises a crosslinkable polymer and where the polymer can be crosslinked using thermal energy, radiation, or a combination thereof.

Embodiment 20 provides a mold comprising:
a substrate;
a textured first coating disposed on the substrate; where the textured first coating is derived from metal oxide nanoparticles that are calcined to form the mold.

Embodiment 21 provides the mold according to Embodiment 20, where the calcining is achieved by exposing the textured first coating to electromagnetic radiation.

Embodiment 22 provides the mold according to any one of Embodiments 20-21, where substrate is a rough surface and where a surface of the substrate is smoothened by the repeated deposition of coating material on the substrate; where each successive coating is calcined prior to depositing another coating layer.

Embodiment 23 provides the mold according to any one of Embodiments 20-22, which is used as a mold to texture a substrate.

Embodiment 24 provides the mold according to any one of Embodiments 20-23, where the substrate comprises a metal, a polymer, and a ceramic.

Embodiment 25 provides the mold according to any one of Embodiments 24, where the metal comprises steel, brass, bronze, nickel, iron, aluminum, titanium, copper, cobalt, or a combination thereof; where the polymeric substrates comprise polyolefins, polysiloxanes, polyfluoroethylenes, polyacrylates, polystyrenes, polyimides, polyesters, or a combination thereof; where the ceramic substrates comprise silica, alumina, titania, quartz, zirconia, ceria, or a combination thereof.

Embodiment 26 provides the mold according to any one of Embodiments 20-25, where the textured first coating comprises architectural elements having an aspect ratio of greater than 5:1.

Embodiment 27 provides a method of preparing a mold, comprising the steps:
(a) applying a nanoparticle coating to a surface of a substrate to obtain a coated substrate having a nanoparticle layer;
(b) contacting the nanoparticle layer on the coated substrate with a textured solvent-permeable stamp so as to imprint a texture onto the nanoparticle layer;
(c) transferring solvent away from the nanoparticle layer; and
(d) removing the textured solvent-permeable stamp from the nanoparticle layer;
so as to obtain a mold,
wherein the nanoparticle coating comprises nanoparticles or nanoparticle precursors, or a combination thereof, dispersed in a solvent.

Embodiment 28 provides the method according to Embodiment 27, wherein the stamp is a bilayer composite polydimethylsiloxane stamp.

Embodiment 29 provides the method according to any one of Embodiments 27-28, wherein the nanoparticle coating comprises indium tin oxide nanoparticles, $TiO_2$ nanoparticles or $ZrO_2$ nanoparticles.

Embodiment 30 provides the method according to any one of Embodiments 27-29, wherein the solvent is NMP, ethanol, methanol or 1,2-propane diol, or a mixture thereof.

Embodiment 31 provides the method according to any one of Embodiments 27-30, wherein in step (c) the solvent is transferred away via diffusion of solvent through the textured solvent-permeable stamp.

Embodiment 32 provides the method according to any one of Embodiments 27-31, wherein in step (c) the solvent is transferred away via heat.

Embodiment 33 provides the method according to any one of Embodiments 27-32, further comprising a step before or after step (d) of calcining, annealing, sintering the nanoparticle layer and coated substrate.

Embodiment 34 provides the method according to any one of Embodiments 27-33, wherein the nanoparticle coating comprises a indium tin oxide nanoparticle precursor or $TiO_2$ nanoparticles precursor.

Embodiment 35 provides the method according to any one of Embodiments 27-34, wherein the nanoparticle coating further comprises a polymer or polymer precursor.

Embodiment 36 provides the method according to any one of Embodiments 27-35, further comprising the step of treating the nanoparticle coating with electromagnetic radiation.

Embodiment 37 provides the method according to any one of Embodiments 27-36, wherein the substrate is flexible.

Embodiment 38 provides the method according to any one of Embodiments 27-37, wherein the texture comprises architectural elements having an aspect ratio of greater than 5:1.

Embodiment 39 provides a mold obtained according to any one of Embodiments 27-37.

Embodiment 40 provides the method or mold of any one or any combination of Embodiments 1-38 optionally configured such that all elements or options recited are available to use or select from.

What is claimed is:

1. A method comprising:
disposing upon a first substrate, a first coating comprising metal oxide nanoparticles dispersed in a solvent, wherein the metal oxide nanoparticles are 80 wt % or more of the first coating;
texturing the first coating with a microporous solvent-permeable stamp, wherein the stamp is an elastomeric stamp that comprises a texture and has micropores that absorb the solvent, the stamp extracts the solvent from the first coating while texturing the coating, and the texturing is performed in a high humidity environment, wherein the high humidity environment has a relative humidity of 70% or more;
transferring solvent away from the textured first coating with the microporous solvent-permeable stamp until the first coating is substantially devoid of the solvent;
treating the textured first coating to form a master mold; wherein the master mold contains a mirror image of the texture contained in the textured, solvent-permeable stamp; and
transferring the texture from the master mold to a second substrate.

2. The method of claim 1, wherein treating the textured first coating comprises calcining and the resulting master mold comprises metal oxide pillars with aspect ratios of 5:1 or greater.

3. The method of claim 1, wherein the second substrate comprises a second coating disposed thereon.

4. The method of claim 1, wherein the first coating comprises 10 to 50 wt % of a sol-gel and comprises a metal oxide precursor sol.

5. The method of claim 1, wherein the textured first coating comprises architectural elements having an aspect ratio of greater than 5:1.

6. The method of claim 1, wherein the first coating comprises nanoparticles having an average particle size of less than 100 nanometers.

7. The method of claim 6, wherein the nanoparticles comprise titania, silica, zirconia, ceria, indium titanium oxide, tin oxide, indium oxide, antimony oxide, or a combination thereof, and the first coating further comprises one or more nanoparticle precursor, polymer, or polymer precursor.

8. The method of claim 4, wherein the metal oxide precursor is titanium isopropoxide, titanium butoxide, tetraethoxysilane, tetramethoxysilane, vinyltrialoxysilanes, vinyltrimethoxysilane, aluminum sec-butoxide, zirconium isopropoxide, cerium isopropoxide, acetylacetonate titanate chelate, triethanolamine titanate chelate, lactic acid titanate chelate, zirconate chelates, zirconium propionate, or a combination thereof.

9. The method of claim 1, comprising treating the textured first coating with electromagnetic radiation; wherein the electromagnetic radiation comprises at least one of heat at 200 to 2000° C., microwave radiation, near infrared radiation, ultraviolet radiation, and an electron beam.

10. The method of claim 1, wherein transferring the solvent away is performed by diffusing the solvent through the textured solvent-permeable stamp, the stamp is operative to extract the solvent from the first coating, the stamp comprises a composite polydimethylsiloxane (PDMS) stamp, which comprises a h-PDMS layer comprising the texture, a backing layer that provides support for the h-PDMS layer, and wherein the stamp is heated to a temperature of 30 to 250° C. while the stamp is in contact with the first coating.

11. The method of claim 1, wherein the stamp is an elastomeric stamp that is operative to extract a portion of solvent from the first coating and comprises a polysiloxane, a polybutadiene, a polyisoprene, a styrene-butadiene rubber, a poly(styrene)-block-poly(butadiene), a poly(acrylonitrile)-block-poly(styrene)-block-poly(butadiene) (ABS), a polychloroprene, an epichlorohydrin rubber, a polyacrylic rubber, a fluorosilicone elastomer, a fluoroelastomer, a perfluoroelastomer, a polyether block amides (PEBA), a chlorosulfonated polyethylene, an ethylene propylene diene rubber (EPR), an ethylene-vinyl acetate elastomer, or a combination thereof.

12. The method of claim 1, wherein the substrate comprises a metal, a polymer or a ceramic.

13. The method of claim 12, wherein the metal comprises steel, brass, bronze, nickel, iron, aluminum, titanium, copper, cobalt, or a combination thereof; the polymer comprises polyolefins, polysiloxanes, polyfluoroethylenes, polyacrylates, polystyrenes, polyimides, polyesters, or a combination thereof; and the ceramic comprises silica, alumina, titania, quartz, zirconia, ceria, or a combination thereof.

14. The method of claim 1, wherein the substrate is flexible.

15. The method of claim 1, wherein the second coating comprises thermoplastic polymers, thermosetting polymers, blends of thermoplastic polymers, blends of thermosetting polymers, and blends of thermoplastic polymers with thermosetting polymers; and the polymers are selected from the group of polyacetals, polyacrylics, polycarbonates polystyrenes, polyesters, polyamides, polyamideimides, polyarylates, polyacrylates, polymethylmethacrylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyoxadiazoles, polybenzothiazinophenothiazines, polybenzothiazoles, polypyrazinoquinoxalines, polypyromellitimides, polyquinoxalines, polybenzimidazoles, polyoxindoles, polyoxoisoindolines, polydioxoisoindolines, polytriazines, polypyridazines, polypiperazines, polypyridines, polypiperidines, polytriazoles, polypyrazoles, polypyrrolidines, polycarboranes, polyoxabicyclononanes, polydibenzofurans, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, polysiloxanes, polyolefins, polyacrylamides, epoxy polymers, unsaturated polyester polymers, polyimide polymers, bismaleimide polymers, bismaleimide triazine polymers, cyanate ester polymers, vinyl polymers, benzoxazine polymers, benzocyclobutene polymers, acrylics, alkyds, phenol-formaldehyde polymers, novolacs, resoles, melamine-formaldehyde polymers, urea-formaldehyde polymers, hydroxymethylfurans, isocyanates, unsaturated polyesterimides, or a combination thereof.

16. The method of claim 1, wherein the second coating comprises a crosslinkable polymer and the crosslinkable polymer can be crosslinked using thermal energy, radiation, or a combination thereof.

17. The method of claim 1, wherein the solvent is NMP, ethanol, methanol or 1,2-propane diol, or a mixture thereof.

18. The method of claim 1, wherein transferring the solvent away is performed by diffusing the solvent through the textured solvent-permeable stamp, the stamp is a composite polydimethylsiloxane (PDMS) stamp, which comprises two layers of elastomer: an elastomer backing layer, and an elastomer texturing layer, wherein the backing layer provides support for the texturing layer, and the texturing layer is thinner and harder than the backing layer, and wherein the stamp comprises recesses to facilitate filling the stamp with the solvent.

19. The method of claim 1, wherein texturing the first coating is performed at a 70-80% relative humidity environment.

20. A method for residual-layer free imprinting comprising:
  disposing upon a first substrate, a first coating comprising metal oxide nanoparticles dispersed in a solvent, wherein the metal oxide nanoparticles are 80 wt % or more of the first coating;
  texturing the first coating while transferring the solvent away from the first coating by using a microporous solvent-permeable stamp, wherein the stamp is an elastomeric stamp comprising: a texture configured for texturing the first coating, surface contact angles configured for dewetting the solvent, and micropores configured for absorbing the solvent and diffusing the solvent through the stamp and away from the first coating;
  transferring solvent away from the textured first coating until the first coating is substantially devoid of the solvent; and
  calcining the textured first coating to form a residual-layer free master mold.

* * * * *